United States Patent
Yuzurihara et al.

(10) Patent No.: US 11,764,666 B2
(45) Date of Patent: Sep. 19, 2023

(54) DC PULSE POWER SUPPLY DEVICE AND FREQUENCY CONTROL METHOD FOR DC PULSE POWER SUPPLY DEVICE

(71) Applicant: KYOSAN ELECTRIC MFG. CO., LTD., Yokohama (JP)

(72) Inventors: Itsuo Yuzurihara, Yokohama (JP); Toshiyuki Adachi, Yokohama (JP); Tomohiro Yoneyama, Yokohama (JP); Koichi Miyazaki, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 134 days.

(21) Appl. No.: 17/602,074

(22) PCT Filed: Nov. 8, 2019

(86) PCT No.: PCT/JP2019/043869
§ 371 (c)(1),
(2) Date: Oct. 7, 2021

(87) PCT Pub. No.: WO2020/208853
PCT Pub. Date: Oct. 15, 2020

(65) Prior Publication Data
US 2022/0209651 A1   Jun. 30, 2022

(30) Foreign Application Priority Data
Apr. 11, 2019 (JP) ................. 2019-075939

(51) Int. Cl.
*H02M 1/40* (2007.01)
*H02M 1/34* (2007.01)
*H02M 3/156* (2006.01)

(52) U.S. Cl.
CPC ............. *H02M 1/40* (2013.01); *H02M 1/346* (2021.05); *H02M 3/156* (2013.01)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS

| | | | | |
|---|---|---|---|---|
| 6,259,235 B1* | 7/2001 | Fraidlin | ................. | H02M 3/158 323/290 |
| 7,492,138 B2* | 2/2009 | Zhang | ............... | H02M 3/33592 323/224 |
| 7,579,814 B2* | 8/2009 | Orr | ........................ | H02M 3/155 323/225 |

(Continued)

FOREIGN PATENT DOCUMENTS

| | | |
|---|---|---|
| JP | 8-222258 A | 8/1996 |
| JP | 2004-23825 A | 1/2004 |
| JP | 2006-6053 A | 1/2006 |
| WO | 2018/021510 A1 | 2/2018 |

OTHER PUBLICATIONS

International Search Report dated Jan. 28, 2020, issued in counterpart International Application No. PCT/JP2019/043869 (2 pages).
(Continued)

*Primary Examiner* — Jeffrey A Gblende
(74) *Attorney, Agent, or Firm* — WHDA, LLP

(57) ABSTRACT

This DC pulse power supply device comprises a voltage clamper including a capacitor that is connected in parallel to a DC reactor in a chopper circuit provided in a pulsing unit in order to suppress increases in the surge voltage resulting from the leakage inductance of the DC reactor. During the start-up of pulsing operation, which is the initial stage of the pulse mode, the frequency of the pulsing operation of the chopper circuit is controlled over the period until the capacitor voltage is charged to a sufficient voltage to reset the magnetic saturation of the DC reactor.

9 Claims, 14 Drawing Sheets

(58) Field of Classification Search
CPC .............. G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H05B 39/048; B23K 11/24; H04B 2215/069

See application file for complete search history.

(56) References Cited

U.S. PATENT DOCUMENTS

| 7,843,178 | B1 | 11/2010 | Houk et al. | |
|---|---|---|---|---|
| 2004/0004848 | A1* | 1/2004 | Yuzurihara | H02M 3/3376 |
| | | | | 363/16 |
| 2015/0002128 | A1 | 1/2015 | Cho | |
| 2018/0123440 | A1 | 5/2018 | Lee et al. | |
| 2019/0165666 | A1 | 5/2019 | Nishimoto et al. | |

OTHER PUBLICATIONS

Qun Zhao et al.; High-Efficiency, High Step-Up DC-DC Converters, IEEE Transactions on Power Electronics Institute of Electrical and Electronics Engineers, USA, vol. 18, No. 1, Jan. 1, 2003, pp. 65-73, XP-011078309. cited in Extended (Supplementary) European Search Report (9 pages).

Office Action dated May 1, 2023, issued in counterpart KR application No. 10-2021-7029981, with English translation. (9 pages).

Extended (Supplementary) European Search Report dated Apr. 5, 2023, issued in counterpart application No. 19924354.4. (9 pages).

* cited by examiner

DCL CURRENT WAVEFORM DURING FREQUENCY CONTROL

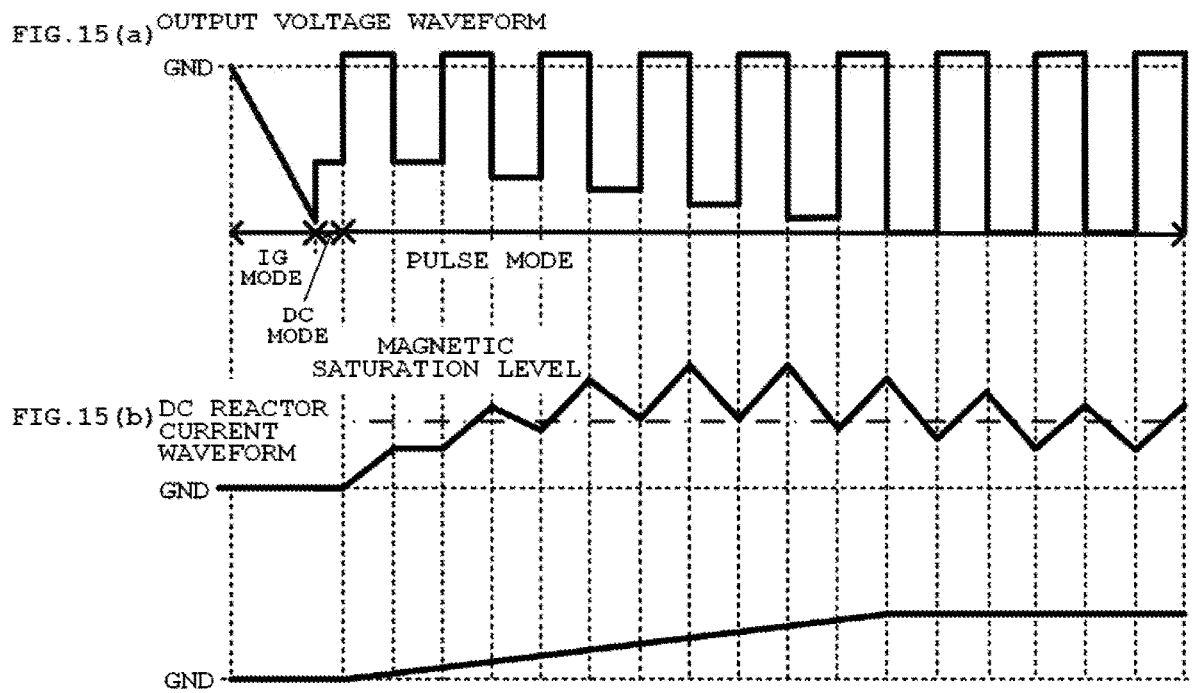
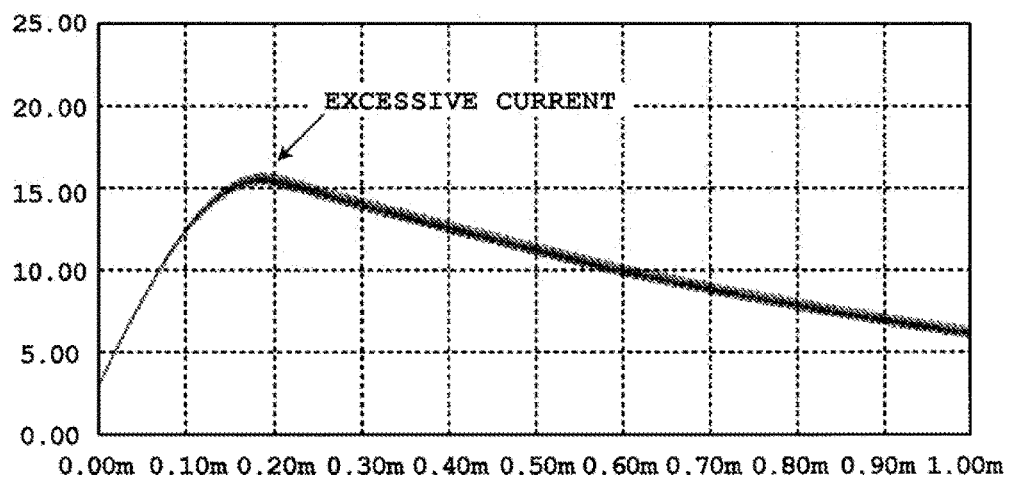
DC REACTOR CURRENT DURING MAGNETIC SATURATION

US 11,764,666 B2

DC PULSE POWER SUPPLY DEVICE AND FREQUENCY CONTROL METHOD FOR DC PULSE POWER SUPPLY DEVICE

TECHNICAL FIELD

The present invention relates to a DC pulse power supply device comprising a control circuit unit for preventing an occurrence of magnetic saturation, and a control method for preventing a DC reactor included in the DC pulse power supply device from reaching the magnetic saturation.

BACKGROUND ART

There is known circuitry of a DC pulse power supply device as a pulse generation circuit for generating a pulse output, comprising a series circuit composes of a DC reactor and a switching element. The pulse generation circuit repeatedly performs an ON/OFF operation of the switching element to interrupt a DC voltage, thereby obtaining a pulse output with a pulse waveform.

A pulse output from a DC pulse power supply device is a high-frequency output that continuously turns on and off a DC voltage in a range of several Hz to hundreds KHz.

The DC pulse power supply device is used for supplying the pulse output to a load of a plasma generation device, an exciting of a pulse laser, an electrical discharge machine or similar. For example, in the case of using the DC pulse power supply device as a plasma generation device, the pulse output is supplied between electrodes in a plasma generating chamber, an electrical discharge is occurred between the electrodes so as to ignite plasma and keep the generated plasma.

FIG. 12 shows a configuration example of the DC pulse power supply device, in which the DC pulse power supply device comprises a pulse generation circuit having a chopper circuit. As a circuit for creating a pulse waveform, a step-up chopper circuit is well known. A DC pulse power supply device 100 consists of a DC power supply unit 110, a pulsing unit 120 and a control circuit unit 140. A step-up copper circuit of the pulsing unit 120 is composed of a DC reactor 121 and a switching element 122, which are connected in series. The control circuit unit 140 controls a drive circuit 123. The switching element 122 performs an ON/OFF operation in response to a drive signal from the drive circuit 123. The pulsing unit 120 supplies to a load 150 with a pulse output obtained by boosting a DC voltage in the DC power supply unit 110 (see Patent Literatures 1 and 2).

CITATION LIST

Patent Literature

[Patent Literature 1] Japanese Patent Laid-Open Publication No. 222258/1996 (FIG. 1, Paragraph 0012)
[Patent Literature 2] Japanese Patent Laid-Open Publication No. 2006-6053 (FIG. 1)

SUMMARY OF THE INVENTION

Problems to be Solved by the Invention

In the case of using the DC pulse power supply device as a plasma generation device, a pulse output of the DC pulse power supply device is supplied between electrodes in a chamber of the plasma generation device, and ignites plasma by an electrical discharge occurring between the electrodes, thereby maintaining the generated plasma. When the plasma is used as load, the DC pulse power supply device supplies the pulse output to a plasma load by processing in an ignition mode, a DC mode and a pulse mode. The ignition mode ignites the plasma, the DC mode in turn maintains a certain discharge voltage state, and then the pulse mode activates a pulsing operation.

FIG. 13 is a schematic flowchart illustrating each mode that allows the DC pulse power supply device to supply the pulse output to the plasma load.

The plasma generation device typically corresponds to an electrical load for the DC pulse power supply device, and there is a difference in impedance states between a load at the start of plasma discharge until the plasma discharge occurs and a load during a normal operation in which the plasma discharge occurs stably. Thus, in general, the DC power supply device gradually boosts a voltage to develop the plasma discharge, thereby applying a voltage greater than a voltage in the normal operation to the electrodes over a predetermined period. The mode that performs the above output is called as ignition mode (S10).

The occurrence of the plasma discharge by the ignition mode leads to a certain discharge voltage state. This mode for the above output is called as DC mode (S20).

After the DC mode, a DC voltage is turned ON/OFF with a predetermined duty to bring a pulse output state. This mode that performs the above output is called as pulse mode (S30).

In a chopper circuit of a pulsing unit 120A shown in FIG. 14(a), as to a DS voltage between a drain D and a source S of a switching element 122A, a surge voltage is generated by a leakage inductance included in a DC reactor 121A during an OFF state of the switching element 122A.

The inventors of the present application suggest a configuration for preventing the switching element 122A from being damaged by the surge voltage, in which configuration a voltage clamping unit 130B is provided to clamp a voltage across a DC reactor 121B to a predetermined voltage. FIG. 14(b) shows a schematic view of suggested circuitry. The voltage clamping unit 130B has a capacitor C connected in parallel to the DC reactor 121B. The voltage clamping unit 130B clamps a capacitor voltage VC of the capacitor C to a voltage lower than the surge voltage to thereby suppress an excessive rise in the DS voltage.

In general, permeability of a reactor decreases as a magnetic field increases due to an increase in a reactor current, and when a magnetic flux density of a magnetic material reaches its peak, the reactor reaches a magnetic saturation state. In the magnetic saturation state, the permeability decreases. Low permeability of the reactor causes overcurrent. The magnetic saturation of the reactor is reset when a voltage with a polarity different to that of the reactor is applied to the reactor and a voltage-time product (ET product), which is a product of applied voltage and time, is equal in magnitude to the reverse polarity.

In FIG. 14(c), a voltage-time product Son in an ON period of a switching element 122B is equalized to a voltage-time product Soff in an OFF period in magnitude with opposite polarity, so that the magnetic saturation of the DC reactor 121B is reset.

FIGS. 15(a) and 15(b) illustrate the magnetic saturation state of the DC reactor, in which FIG. 15(a) shows a waveform of an output voltage of the DC power supply device, FIG. 15(b) shows a waveform of a saturation current of a DC reactor current iDCL, and FIG. 15(c) shows a waveform of a voltage of the capacitor C.

The circuitry including a voltage clamping unit has a drawback that the magnetic saturation of the DC reactor cannot be reset adequately. FIG. 14(c) shows a status of occurrence of the magnetic saturation. A voltage in the OFF period of the switching element 122B serves as reset voltage, the reset voltage being clamped to a capacitor voltage VC in the capacitor C of a voltage clamping unit 130B. Since the capacitor voltage VC is boosted gradually from 0V during activation by pulse generation, the reset voltage is not boosted adequately for resetting the magnetic saturation in the initial stage. Consequently, in the pulse mode in an initial stage during activation by the pulse generation, the voltage-time product Soff in the OFF period of the switching element 122B is smaller than the voltage-time product Son in the ON period of the switching element 122B, and thus the magnetic deviation of the DC reactor is not reset, and leads to the magnetic saturation.

When the DC reactor 121 reaches the magnetic saturation, an inductance decreases, and thereby an excessive current flows. FIGS. 15(a) and 15(b) show an example of a current in the DC reactor that presents a state where the excessive current is generated due to the magnetic saturation. Thus, since the degree of the reset voltage is not sufficient for resetting the magnetic saturation in the pulse mode in the early stage during activation by the pulse generation, a problem arises that the excessive current is generated due to the magnetic saturation.

It is an object of the present invention to solve the above-described problems, and prevent the occurrence of the magnetic saturation of the DC reactor during the activation by the pulse generation and prevent the generation of the excessive current due to the magnetic saturation in the DC pulse power supply device.

More specifically, it is an object of the invention to suppress the DC reactor current to prevent occurrence of the magnetic saturation during the activation by the pulse generation while the capacitor voltage of the capacitor connected in parallel to the DC reactor reaches a voltage sufficient to reset the magnetic saturation.

Means for Solving the Problem

In order to prevent the rise in the surge voltage generated by the leakage inductance of the DC reactor in the chopper circuit included in the pulsing unit, the DC pulse power supply device of the invention has a voltage clamping unit including a capacitor connected in parallel to the DC reactor. In the DC pulse power supply device, a reactor voltage during the OFF state of the switching element of the chopper circuit is suppressed by the voltage clamping unit, leading to the occurrence of the magnetic saturation of the DC reactor. A control circuit unit of the DC pulse power supply device of the invention controls a frequency of the operation of the switching element, so as to prevent the occurrence of the magnetic saturation of the DC reactor.

The DC pulse power supply device of the present invention controls a frequency of the pulsing operation of the chopper circuit during the activation of the pulsing operation which is the initial stage of the pulse mode until the capacitor voltage is charged enough to reset the magnetic saturation of the DC reactor. An aspect of the frequency control includes making the time width of the OFF period variable, during which the switching element is in the OFF state.

In the ON period, a power supply voltage is applied to the DC reactor to increase a reactor current.

On the other hand, in the OFF period, the capacitor voltage is applied to the DC reactor, so as to clamp a voltage to the capacitor voltage.

(Aspect of Frequency Control)

An aspect of the frequency control is to fix a time width Ton in the ON period, while gradually decreasing a time width Toff in the OFF period as the capacitor voltage is increased, and when the capacitor voltage is small, define the time width Toff in the OFF period to be longer, so as to gradually decrease the time width Toff in the OFF period as the capacitor voltage is increased. This frequency control prevents the increase in a difference between the voltage-time product Soff of the OFF period and the voltage-time product Son of the ON period in the initial stage, thereby preventing the occurrence of the magnetic saturation of the DC reactor.

In this context, the gradual increase or decrease in the time width means that the time width is increased or decreased little by little from its initial value to a predetermined value. The predetermined value of the time width after the gradual increase or decrease means a time width in each period in a cycle after the completion of charging the capacitor voltage to a degree adequate for resetting the magnetic saturation of the DC reactor, and the predetermined value corresponds to the time width in the OFF period or ON period in each cycle in the steady stage. The initial value of the time width in the OFF period is longer than the time width in the OFF period in the steady stage.

After the activation of the pulsing operation, the capacitor voltage is boosted in the initial stage, and when the capacitor voltage is completely charged, the stage is changed to the steady stage. Since the voltage across the DC reactor in the OFF period is clamped to the charging voltage of the capacitor, the generation of the surge voltage is prevented.

In the initial stage of the pulse mode, the capacitor voltage is boosted from 0V to a charging voltage. Since the voltage across the DC reactor is clamped to the capacitor voltage during the OFF period, the voltage has an amplitude smaller than that of a voltage in the steady stage. Thus, if the time width is defined to be the time width in the steady stage, there is a difference between the voltage-time product Son and the voltage-time product Soff that makes it difficult to prevent the occurrence of the magnetic saturation of the DC reactor. The frequency control of the invention gradually decreases the time width Toff in the OFF period in the initial stage, thereby reducing the difference between the voltage-time product Son and the voltage-time product Soff to prevent the occurrence of the magnetic saturation of the DC reactor.

In the steady stage of the pulse mode, the capacitor voltage is adequate for resetting the magnetic saturation of the DC reactor. In this steady stage, the voltage to be applied to the DC reactor is limited to the clamp voltage of the capacitor voltage. However, since the capacitor voltage is adequate for resetting the magnetic saturation of the DC reactor, the DC reactor does not reach the magnetic saturation in a cycle that has the ON period and the OFF period of the steady stage.

The present invention has embodiments of a DC pulse power supply device and a frequency control method for the DC pulse power supply device.

(DC Pulse Power Supply Device)

The DC pulse power supply device of the present invention comprises a DC power supply, a pulsing unit, a voltage clamping unit and a control circuit unit. The pulsing unit uses a step-up chopper circuit comprising a series circuit composed of a DC reactor and a switching element so as to generate a pulse output. The voltage clamping unit uses a capacitor voltage in a capacitor connected in parallel to the DC reactor of the pulsing unit to clamp a voltage across the DC reactor to a clamp voltage. The control circuit unit controls a switching operation of the switching element of the pulsing unit.

The control circuit unit comprises a pulse mode control unit that controls a pulsing operation of a pulse mode for generating the pulse output. The pulsing operation of the pulse mode repeatedly performs an ON/OFF operation of the switching element at a certain duty ratio to thereby supply electric power from the DC power supply to a load with the pulse output according to the duty ratio.

The pulse mode control unit comprises a frequency control unit that makes a frequency variable. The frequency control unit brings the switching element into the ON state to pass a current through the DC reactor, thereby applying a power supply voltage to the DC reactor. At this time, a reactor current increases in the DC reactor. On the other hand, when the switching element is brought into the OFF state, energy accumulated in the DC reactor by the reactor current generates a reactor voltage. The reactor voltage is clamped to the capacitor voltage of the capacitor connected in parallel to the DC reactor.

The frequency control unit makes the frequency of the pulsing operation variable in each of multiple cycles in the initial stage to prevent the occurrence of the magnetic saturation of the DC reactor. After the charge of the capacitor is completed, the variable frequency in the initial stage is changed to a steady frequency in the steady stage.

With respect to the variable frequency, the frequency of the pulsing operation is made variable by fixing time width Ton in the ON period of the switching element in each cycle while gradually decreasing the time width in the other period.

The aspect of the frequency control performs the frequency control by making the time width variable in the OFF period during which the switching element is brought into the OFF state.

(Configuration of Aspect of Frequency Control)

In a configuration of the aspect of the frequency control, the frequency control unit fixes the time width Ton in the ON period of the switching element in each of the multiple cycles in the initial stage of the pulsing operation, and gradually decreases the time width Toff in the OFF period of the switching element as the capacitor voltage increases. The time width Toff in the OFF period is set to be long in the initial stage where the capacitor voltage is small, and is decreased toward the time width in the steady stage as the capacitor voltage increases. The frequency control controls the increase in the difference between the voltage-time product Soff in the OFF period and the voltage-time product Son in the ON period, thereby preventing the occurrence of the magnetic saturation of the DC reactor.

At the start of the pulsing operation, the OFF period is started from its initial value for making the time width variable. After the pulsing operation is started, the pulsing operation is implemented by gradually decreasing the time width in the OFF period from the initial value. During this period, the time width in the other period, namely ON period, remains fixed. After the capacitor voltage reaches a degree adequate for resetting the magnetic saturation, the varied time width is changed to the time width of the steady stage so as to perform the pulsing operation in the steady stage. The time width to be increased or decreased can be set according to drive criteria, such as the number of cycles during which the time width varies from the initial value to the steady value of the steady stage. A determination can be made about whether or not the capacitor voltage reaches the degree adequate for resetting the magnetic saturation based on a voltage value or voltage change of the capacitor voltage in the capacitor.

The pulse mode control unit comprises a voltage evaluating unit that evaluates whether or not the capacitor voltage has reached a charging voltage. The frequency control unit changes a frequency from the variable frequency to the steady frequency in the pulse mode based on a result of the evaluation of the voltage value or a voltage change of the capacitor voltage made by the voltage evaluating unit. When a comparison result between the capacitor voltage and a set voltage shows that the capacitor voltage exceeds the set voltage or when a comparison result between a voltage change $\Delta VC$ in the capacitor voltage and a set value shows that the voltage change $\Delta VC$ is within the set value, the voltage evaluating unit evaluates that the capacitor has been charged and the capacitor voltage has reached the degree adequate for resetting the magnetic saturation of the DC reactor. For the set voltage, a preset charging completion voltage may be used, by way of example.

The DC pulse power supply device of the invention comprises a regeneration unit that regenerates to the DC power supply a component of the reactor voltage in the DC reactor that exceeds the set voltage. The regeneration unit comprises a capacitor connected in parallel to the DC reactor, and uses a capacitor voltage of the capacitor as clamp voltage to thereby suppress a surge voltage by regenerating the component of the reactor voltage in the DC reactor that exceeds the clamp voltage and prevent the occurrence of the magnetic saturation of the DC reactor by the frequency control using the clamped reactor voltage.

(Frequency Control Method for DC Pulse Power Supply Device)

A frequency control method of the present invention is for controlling the DC pulse power supply device of the invention that comprises the DC power supply, the pulsing unit, the voltage clamping unit and the control circuit unit, in which the frequency of the switching operation is controlled until the capacitor voltage reaches the degree adequate for resetting the magnetic saturation of the DC reactor in order to prevent the occurrence of the magnetic saturation of the DC reactor.

The frequency control by the control circuit unit performs pulse mode control for controlling the pulsing operation in the pulse mode for generating the pulse output so as to gradually decrease the time width of each cycle in the multiple cycles in the initial stage of the pulsing operation to make the frequency of the pulsing operation variable.

The variable frequency provides an operation aspect of the pulsing operation in the initial stage.

Operation Aspect: this aspect is for closing the switching element to fix the time width in the ON period during which the power supply voltage is applied to the DC reactor, thereby gradually decreasing the time width in the OFF period during which the switching element is open to clamp the DC reactor voltage to the capacitor voltage.

In the initial stage of the pulsing operation, the capacitor voltage is charged in the process of the frequency control for gradually decreasing the time width in the OFF period. After the charge of the capacitor is completed, the increase in the capacitor voltage stops, so that the voltage is fixed to a constant level. By defining the charging voltage of the capacitor to the degree adequate for resetting the magnetic saturation of the DC reactor, the magnetic saturation of the DC reactor is reset in the steady stage.

The present invention uses this capacitor voltage as a specified voltage. The specified voltage is the capacitor voltage that is adequate for resetting constantly the magnetic saturation in the pulse mode, and functions as a voltage for defining a point to change from the frequency control in the initial stage to the pulse mode in the steady stage. It is possible to detect whether or not the capacitor voltage has reached the specified voltage based on a voltage value or a voltage change of the capacitor voltage, and thus a determination is made on whether or not the capacitor voltage has reached the specified voltage by detecting that the voltage value of the capacitor voltage has reached a specified voltage value or that the voltage change of the capacitor voltage has stopped. The specified voltage value can be defined by obtaining beforehand the voltage value of the capacitor voltage when the capacitor voltage is charged enough to reset the magnetic saturation.

After the capacitor voltage has been charged up to the specified voltage, the frequency control in the initial stage is terminated, and the pulse width is held to a predetermined width in the steady stage to thereby supply a certain amount of electric power to a load. When plasma is used as the load in the steady stage, a pulse output is created based on a predetermined frequency of the pulse mode, so as to supply the pulse output to the plasma load to maintain plasma discharge.

Effects of the Invention

As described above, according to the present invention, the DC pulse power supply device can prevent the magnetic saturation of the DC reactor caused by the pulsing operation to thereby prevent the generation of an excessive current due to the magnetic saturation.

Furthermore, during the pulsing operation of the DC pulse power supply device, the frequency is made variable to prevent the occurrence of the magnetic saturation in the initial stage until the capacitor voltage in the capacitor connected in parallel to the DC reactor reaches the degree adequate for resetting the magnetic saturation, and the frequency control is terminated in the steady stage during which the capacitor voltage reaches the degree adequate for resetting the magnetic saturation to thereby supply the electric power by using the steady frequency in the pulse mode.

BRIEF DESCRIPTION OF THE DRAWINGS

FIGS. 15(a) and 15(b) illustrate a status of the magnetic saturation of the DC reactor: and FIG. 16 illustrates an example of a current in the DC reactor.

BEST MODE FOR CARRYING OUT THE INVENTION

The DC pulse power supply device of the present invention performs frequency control for making a frequency of a pulsing operation variable at the time of activating the pulsing operation, which is an initial stage of a pulse mode, until a capacitor voltage is charged enough to reset magnetic saturation of a DC reactor.

The frequency control of the DC pulse power supply device of the invention will be described by referring to FIGS. 1 to 4, and a schematic configuration of a DC pulse power supply of the invention will be described by referring to FIG. 5. Furthermore, configuration examples of the DC pulse power supply of the invention will be described by referring to FIGS. 6 to 11.

(Frequency Control)

Figure 1:
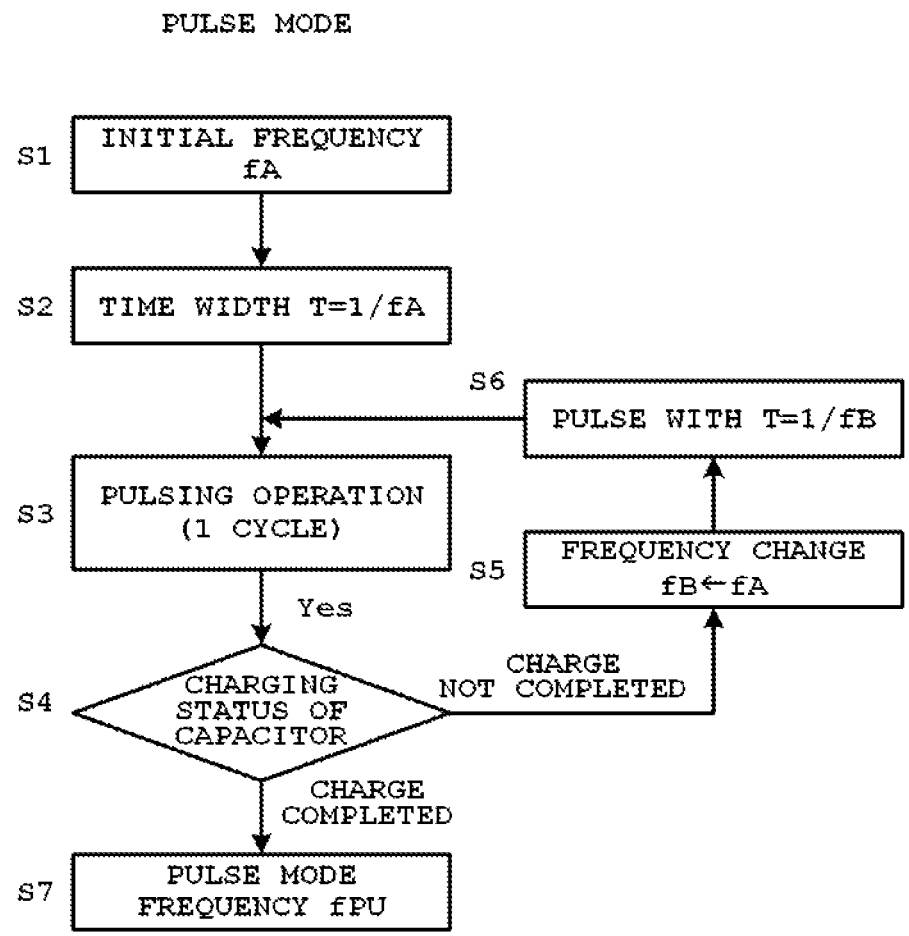
FIG. 1 is a flowchart illustrating frequency control of a DC pulse power supply device of the invention.

FIG. 1 is a flowchart illustrating the frequency control of the DC pulse power supply device of the invention, in which a control flow in the initial stage of the pulse mode is shown.

The DC pulse power supply device of the invention comprises a pulsing unit that has a chopper circuit for generating a pulse output from a DC voltage, and also comprises a voltage clamping unit having a capacitor connected in parallel to the DC reactor of the chopper circuit in order to prevent the rise in a surge voltage generated by a leakage inductance of the DC reactor of the chopper circuit. The voltage clamping unit clamps a voltage across the DC reactor to a capacitor voltage to thereby prevent the rise in the surge voltage.

On the other hand, as a reactor voltage in an OFF state of a switching element of the chopper circuit is suppressed by the voltage clamping unit in the DC pulse power supply device, a voltage-time product is not sufficient for resetting magnetic saturation, causing the DC reactor to reach the magnetic saturation.

The present invention is for performing the frequency control for making the frequency variable in the initial stage of the pulse mode to make a voltage-time product in an OFF state of a switching element adequate for resetting the magnetic saturation, thereby preventing the occurrence of the magnetic saturation caused by clamping a reset voltage. A description will now be made about the control flow performed in the initial stage of the pulse mode by referring to the flowchart shown in FIG. 1.

The frequency control fixes a time width in an ON period in a frequency control interval in the initial stage while making a time width in an OFF period variable, thereby making the frequency variable.

In the initial stage, the pulsing operation is started by using an initial frequency fA in a first cycle (S1). A time width T in one cycle of the above pulsing operation is expressed by (1/fA) (S2).

The time width T in one cycle for the pulsing operation is a time width (Tfix+Tva) that is obtained by combining a fixed time width Tfix in which the time width is fixed and a variable time width Tva in which the time width is variable. The frequency is varied by gradually decreasing the variable time width Tva in each cycle (S3).

In the OFF period, a voltage applied to the DC reactor is clamped to the capacitor voltage. The capacitor voltage is not enough to reset the magnetic saturation of the DC reactor until the charge is completed.

The frequency control of the invention makes the frequency variable during charging the capacitor voltage to thereby prevent the DC reactor from reaching the magnetic saturation. The frequency control with the variable frequency is performed from the start of the pulsing operation until the capacitor voltage is charged enough to reset the magnetic saturation of the DC reactor.

Then, a determination is made about whether or not the charge of the capacitor voltage is completed (S4). If the charge of the capacitor voltage is not completed (S4), the frequency is changed from the initial frequency fA to the variable frequency fB (S5). The time width T in one cycle of the pulsing operation is expressed by (1/fB). Since the fixed time width Tfix is fixed in the time width T (=1/fB), the variable frequency fB is varied by decreasing the variable time width Tva (S6).

In the pulse mode, the pulsing operation has the initial stage at the time of activation and the steady stage after the activation, in which operation the capacitor voltage is boosted in the initial stage, and when the capacitor voltage reaches a degree adequate for resetting, then the pulsing operation goes into the steady stage. When the charge of the capacitor voltage is completed (S4), it is considered that the voltage applied to the DC reactor in the OFF period has reached the degree adequate for resetting the magnetic saturation so as to terminate the frequency control, and thus the frequency is changed from the variable frequency fB to a pulse mode frequency fPU in the steady stage.

The pulse mode frequency fPU is a frequency for the pulse mode for supplying a certain amount of the electric power to the load in the steady stage. A time width TPU in one cycle in the steady stage is defined based on the pulse mode frequency fPU, and a duty of the ON period and the OFF period is defined according to the electric power to be supplied to the load.

In the steady stage, a clamp voltage obtained by the capacitor voltage reaches the degree adequate for resetting the magnetic saturation of the DC reactor. In this steady stage, the voltage to be applied to the DC reactor is limited to the clamp voltage of the capacitor voltage. However, as the capacitor voltage is adequate for resetting the magnetic saturation of the DC reactor, the DC reactor does not reach the magnetic saturation in the pulse mode with the frequency being changed to the steady frequency in the steady stage (S7).

(Aspect of Frequency Control)

The frequency control with the variable frequency can be performed by the aspect of performing the control in each cycle of the pulsing operation for gradually decreasing the time width Toff in the OFF period during which the switching element is in the OFF state.

In the aspect of the frequency control, the time width of the OFF period during which the switching element is in the OFF state is gradually decreased in each cycle of the pulsing operation. The frequency control prevents the increase in a difference between the voltage-time product Soff of the OFF period and the voltage-time product Son of the ON period to thereby prevent the occurrence of the magnetic saturation of the DC reactor.

Now, the aspect of the frequency control will be described.

(Aspect of Frequency Control)

Figure 2:
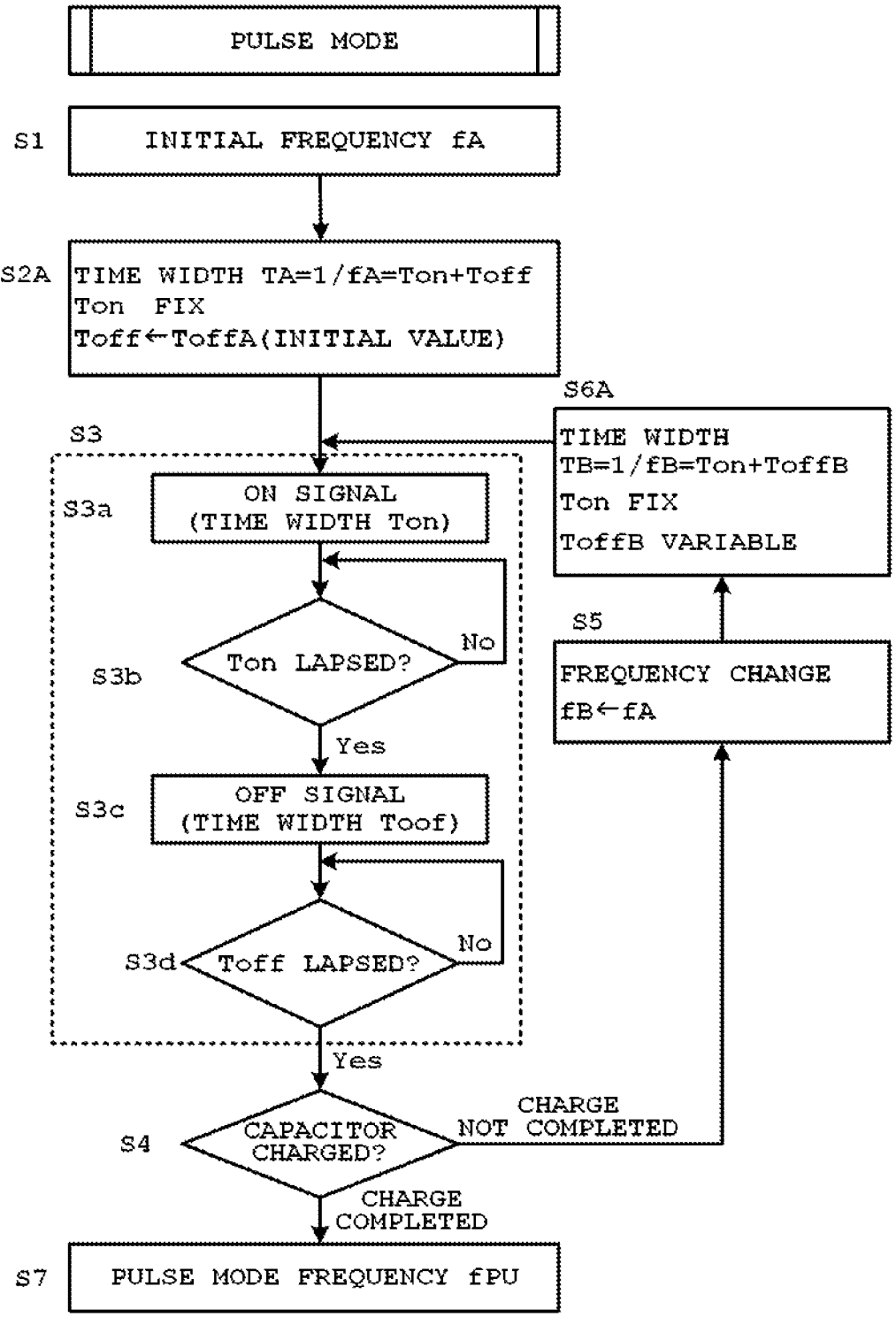
FIG. 2 is a flowchart illustrating a first aspect of the frequency control of the DC pulse power supply device of the invention.
Figure 3A:
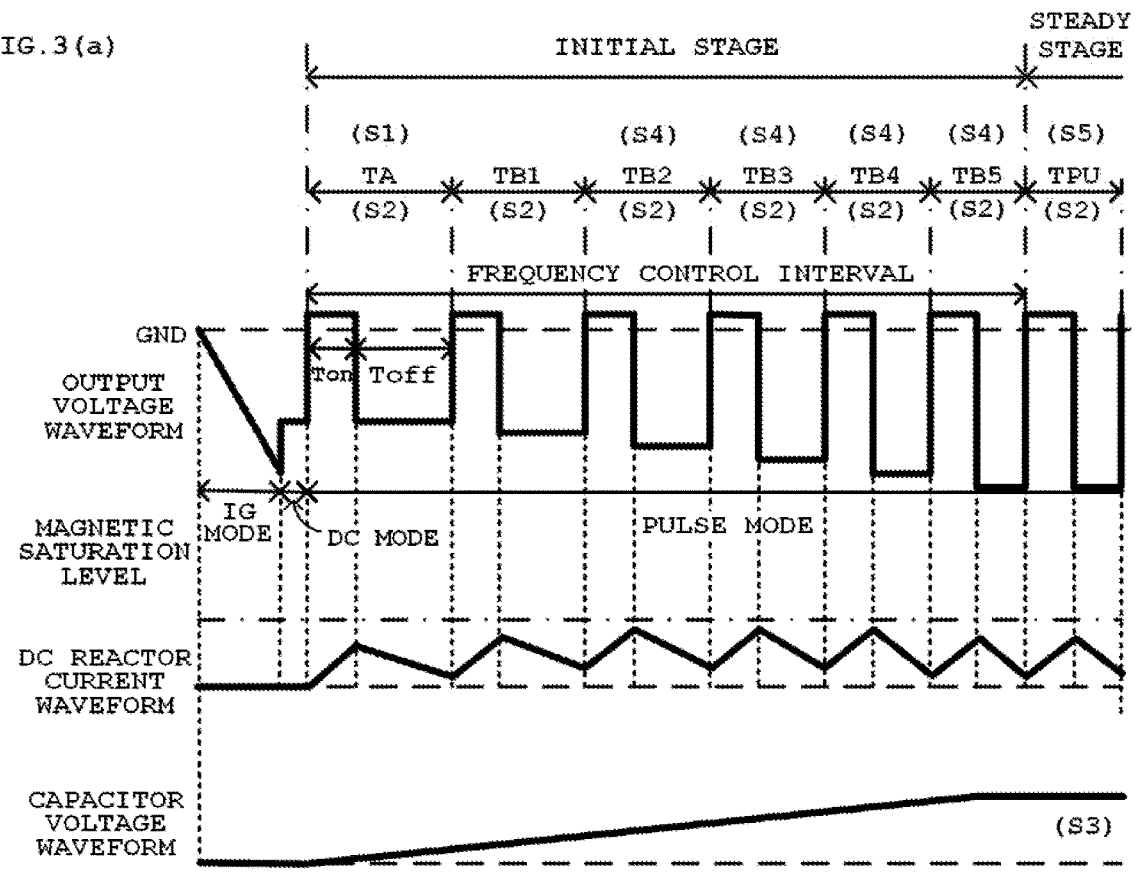
FIGS. 3(a) and 3(b) are a waveform chart illustrating statuses of a voltage and a current according to the first aspect of the frequency control of the DC pulse power supply device of the invention.
Figure 3B:
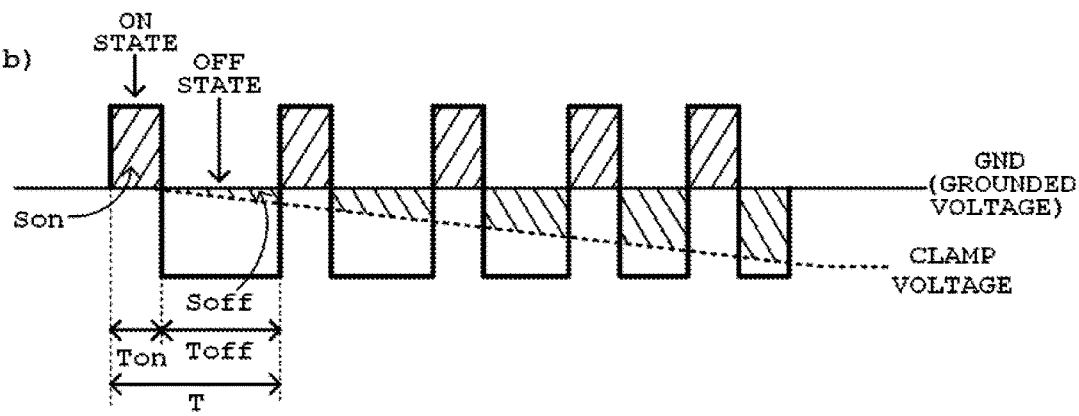

FIG. 2 is a flowchart illustrating a control flow in the aspect of the frequency control, and FIGS. 3(a) and 3(b) are a waveform charts illustrating statuses of a voltage and a current in the aspect of the frequency control.

In the initial stage, the pulsing operation is started by using the initial frequency fA in the first cycle (S1). The time width T in one cycle of the above pulsing operation is expressed by (1/fA). The time width T in one cycle of the pulsing operation is a time width that is obtained by combining the time width Ton in the ON period during which the switching element is in the ON state and the time width Toff in the OFF period during which the switching element is in the OFF state, and the time width Ton in the ON period is the fixed time width Tfix in which the time width is fixed and the time width Toff in the OFF period is the variable time width Tva in which the time width is variable. The time width Toff in the OFF period is gradually decreased from its initial value ToffA to thereby vary the frequency (S2A).

The control circuit unit outputs an ON signal of the time width Ton (S3a), so as to close the switching element during the time width Ton to bring the switching element into the ON state (S3b).

After a lapse of the time width Ton, the control circuit unit outputs an OFF signal of the time width Toff (S3c), so as to open the switching element during the time width Toff to bring the switching element into the OFF state. The time width Toff is set to the initial value ToffA in the first cycle in the initial stage, and then set to a time width ToffB that is varied according to the variable frequency fB in the subsequent cycles (S3d).

After a lapse of the time width Toff, an evaluation is made on whether or not the charge of the capacitor voltage is completed (S4). If the charge of the capacitor voltage is not completed (S4), the frequency is changed from the initial frequency fA to the variable frequency fB (S5).

Since the time width Ton in the ON period is fixed to the fixed time width Tfix, the time width is changed into the time width ToffB in the OFF period to make the frequency variable. The time width TB in one cycle of the pulsing operation when the frequency is variable is expressed by (1/fB), and the time width ToffB in the OFF period is gradually decreased to thereby increase the frequency fB (S6A).

When the charge of the capacitor voltage is completed (S4), it is considered that the voltage applied to the DC reactor in the OFF period has reached the degree adequate for resetting the magnetic saturation so as to terminate the frequency control, and thus the frequency is changed from the variable frequency fB to the pulse mode frequency fPU in the steady stage (S7).

FIG. 3(a) shows a waveform of the output voltage, a waveform of a DC reactor saturation current and a waveform of the capacitor voltage.

In the interval of the frequency control in the initial stage, the time width is gradually shortened from the time width TA in the first cycle to increase the frequency to the level in the steady state. Since the time width Ton in the ON period during which the switching element is in the ON state in each cycle is a fixed time width, the time width Toff in the OFF period during which the switching element is in the OFF state is changed to make the frequency variable. The waveform of the output voltage in FIG. 3(a) shows that the time width Ton is fixed in each cycle, whereas the time width Toff is gradually shortened, and an amplitude of an output voltage in the OFF state of the switching element increases toward an amplitude of an output voltage in the steady stage. The capacitor voltage rises in the initial stage from 0V to a charging completion voltage.

FIG. 3(b) is a schematic diagram illustrating a state of preventing the magnetic saturation by the frequency control. A voltage with a reverse polarity is applied to the DC reactor during the ON period and the OFF period of the switching element. The voltage-time product Son in the ON period is a product of the voltage and the time width Ton in the ON period, the voltage in the ON period being close to a power supply voltage.

On the other hand, the voltage-time product Soff in the OFF period is a product of the voltage in the OFF period and the time width Toff. The voltage in the OFF period is clamped to the capacitor voltage so as to be boosted from 0V to the charging completion voltage of the capacitor. Since the voltage in the OFF period is low in the initial stage, the voltage-time product Soff is not enough with respect to the voltage-time product Son for resetting the magnetic saturation in the state where the time width Toff is fixed.

The frequency control of the invention fixes the time width Ton in the ON period while making the time width Toff in the OFF period variable, thereby gradually decreasing a time width that is longer than the time width in the steady stage as the capacitor voltage rises. By gradually decreasing the time width Toff in the OFF period as the capacitor voltage rises, the voltage-time product Soff becomes comparable to the voltage-time product Son in each cycle to prevent the occurrence of the magnetic saturation.

The DC reactor saturation current repeatedly increases in the ON period and decreases in the OFF period. As the DC reactor is prevented from reaching the magnetic saturation by the frequency control, the DC reactor saturation current is suppressed below a magnetic saturation level.

(Steady Stage of Pulse Mode)

In the steady stage of the pulse mode, the pulsing operation is performed with the frequency in the steady stage. In the steady stage, the capacitor voltage VC is charged to the degree adequate for resetting the magnetic saturation of the DC reactor, so that the DC reactor is reset without reaching the magnetic saturation, and the DC reactor current iDCL varies in each cycle but does not exceed the magnetic saturation level.

Figure 4:
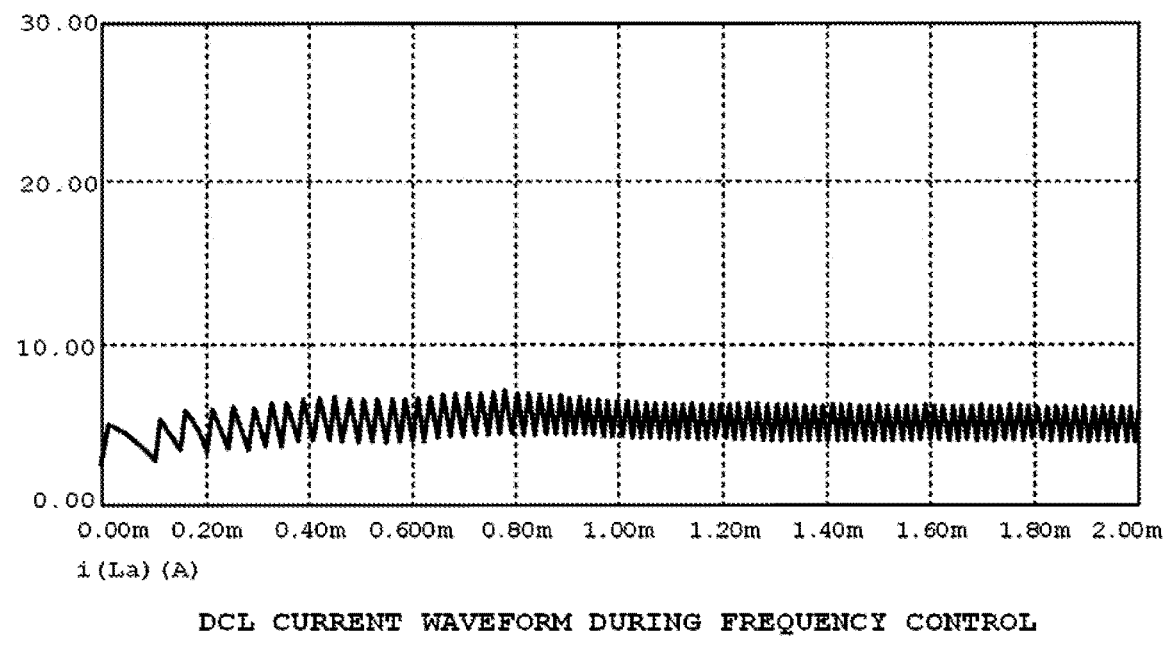
FIG. 4 is a current waveform chart of a DC reactor current in the frequency control of the invention.

FIG. 4 shows a current waveform of the DC reactor current obtained by the frequency control according to the present invention. The illustrative current waveform shows that the DC reactor current does not become an excessive current in either of the ignition mode, the DC mode, or the initial stage or the steady stage of the pulse mode.

(Schematic Configuration of DC Pulse Power Supply Device)

Figure 5:
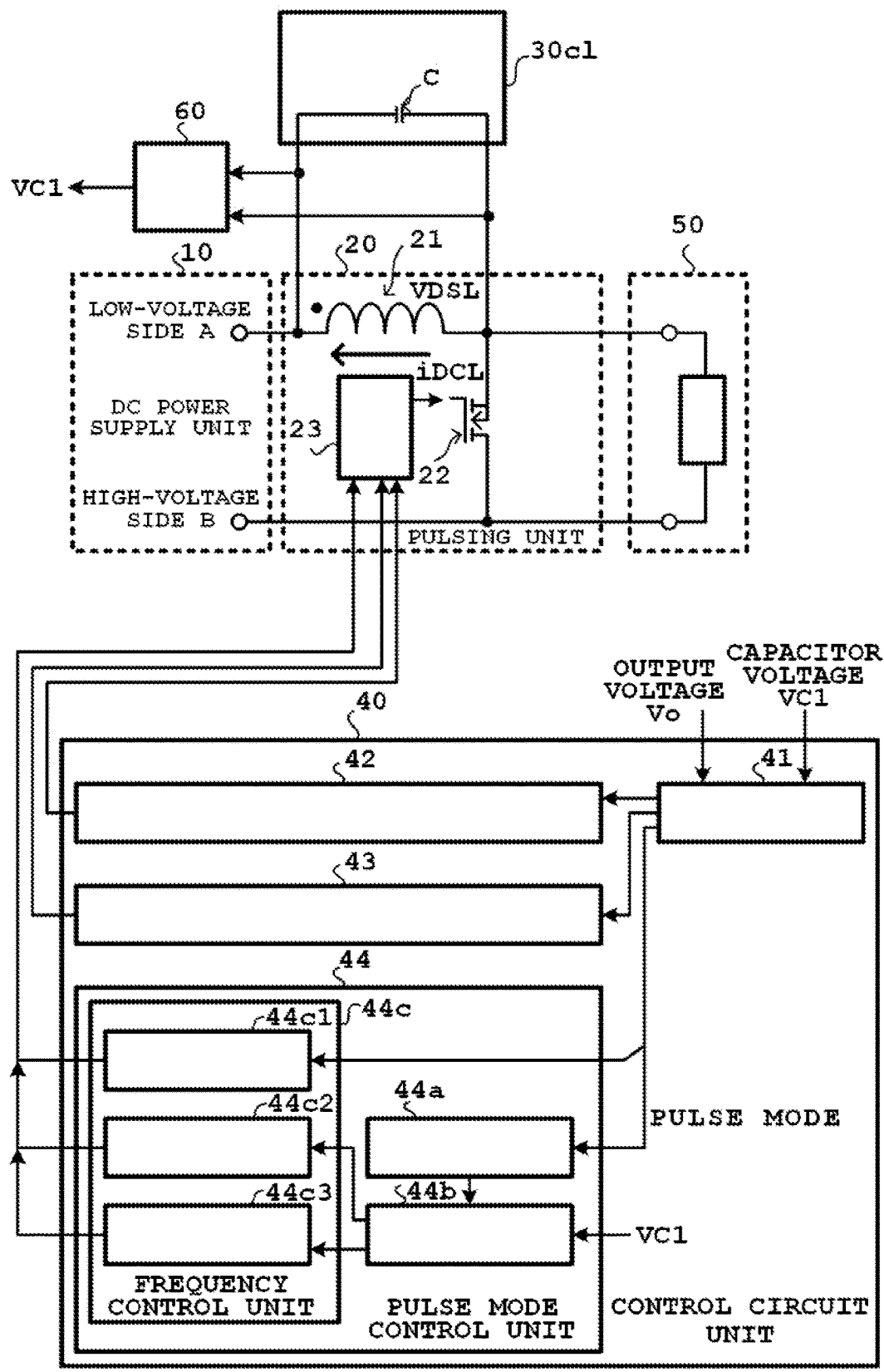
FIG. 5 illustrates a schematic configuration of the DC pulse power supply device of the invention.

FIG. 5 shows a configuration example of the DC pulse power supply device of the present invention. The DC pulse power supply device comprises a DC power supply unit 10, a pulsing unit 20, a voltage clamping unit 30cl, a control circuit unit 40 and a voltage detecting unit 60. The pulsing unit 20 supplies a pulse output produced from a DC voltage in the DC power supply unit 10 to a load 50.

The pulsing unit 20 can be configured by a step-up chopper circuit. The pulsing unit 20 comprises a step-up chopper circuit configured by connecting in series the DC reactor 21 and the switching element 22. The DC reactor 21 is connected in series between the DC power supply unit 10 and a load 50, and the switching element 22 is connected in parallel with respect to the load 50 side. The drive circuit 23 performs the ON/OFF operation of the switching element 22 to generate a pulse output with a pulse waveform from the DC voltage. Furthermore, to the DC reactor 21, the capacitor C of the voltage clamping unit 30c1 is connected in parallel.

In the illustrative configuration example, the pulsing unit 20 is provided on the DC power supply side with a terminal B which is grounded and a terminal A for a negative voltage as low-voltage side. In the figure, the switching element 22 is an example of FET, in which a source side S is connected on the low-voltage side and a drain side D is connected on a high-voltage side of a grounded voltage, and a drive signal from the drive circuit 23 is input to a gate side G.

The control circuit unit 40 controls the step-up chopper circuit via the drive circuit 23 to produce a control signal that define a time width or duty ratio between an ON time and an OFF time of the switching element 22 which corresponds to a desired pulse output. The drive circuit 23 outputs a drive signal to the gate G of the switching element 22 based on the control signal from the control circuit unit 40 so as to actuate the ON/OFF operation of the switching element 22.

The source side S of the switching element 22 is connected to the load side of the DC reactor 21, and the drain side D of the switching element 22 is grounded. When the switching element 22 is in an ON state, the load side of the DC reactor 21 is grounded, so that a DC reactor current iDCL flows from the terminal B to the terminal A through the switching element 22 in the ON state and the DC reactor 21. At this time, electromagnetic energy is accumulated in the DC reactor 21. Then, when the switching element 22 turns from the ON state to an OFF state, the energy accumulated in the DC reactor 21 generates a DC reactor voltage VDCL in the DC reactor 21. The step-up chopper circuit repeats the ON and OFF operations of the switching element 22 to boost an output voltage Vo according to the duty ratio of the ON/OFF times.

The voltage clamping unit 30c1 clamps the capacitor voltage VC in the capacitor C to the clamp voltage. When the switching element 22 is in the OFF state, the capacitor C connected in parallel to the DC reactor 21 applies the capacitor voltage VC to the DC reactor 21. Thus, the voltage across the DC reactor 21 is clamped to the clamp voltage by the capacitor voltage VC.

The control circuit unit 40 comprises an ignition mode control unit (IG mode control unit) 42 for igniting the plasma in the ignition mode, a direct-current mode control unit (DC mode control unit) 43 for holding a given discharge voltage state in the DC mode after the ignition of the plasma, a pulse mode control unit 44 for creating a pulse output by the frequency control in the pulse mode, and a mode changing unit 41 for changing each mode.

The pulse mode control unit 44 changes the frequency to make the frequency variable for turning the switching element 22 ON and OFF. In the initial stage, the pulsing operation is firstly performed by one cycle with the initial frequency fA, and then the frequency is changed in multiple cycles with the variable frequency fB to perform the pulsing operation. After the pulsing operation is performed by varying the frequency in the initial stage, the pulsing operation is performed with the steady frequency in the steady stage in each subsequent cycle in the pulse mode, thereby creating the pulse output.

The pulse mode control unit 44 comprises a frequency control unit 44c that makes the frequency variable, and has an aspect that fixes the time width Ton in the ON period during which the switching element is closed to go into the ON state in the initial stage of the pulse mode, while gradually decreasing the time width Toff in the OFF period during which the switching element is open to go into the OFF state, so as to make the frequency variable.

By making the frequency variable, the increase in the difference between the voltage-time product in the ON state of the switching element and the voltage-time product in the OFF state of the switching element is prevented and the occurrence of the magnetic saturation in the initial stage is prevented.

In the steady stage of the pulsing operation, the switching element is open and closed with the frequency of the steady stage of the pulse mode to thereby supply the steady power to the load. In the steady stage, as the capacitor voltage is enough to reset the magnetic saturation of the DC reactor, the DC reactor does not reach the magnetic saturation in the pulse mode where the frequency is changed to the frequency of the steady stage even if the voltage is clamped by the capacitor voltage.

The frequency control unit 44c comprises an initial frequency unit 44c1, a variable frequency unit 44c2 and a pulse mode frequency unit 44c3. The initial frequency unit 44c1 has the initial frequency fA, the variable frequency unit 44c2 produces the variable frequency fB, and the pulse mode frequency unit 44c3 has the pulse mode frequency fPU of the steady stage. Furthermore, the pulse mode control unit 44 comprises, in addition to the frequency control unit 44c, a cycle detecting unit 44a for detecting one cycle, and a voltage evaluating unit 44b for evaluating the status of charging the capacitor by using the capacitor voltage VC or the voltage change ΔVC of the capacitor voltage. The capacitor voltage VC is detected by the voltage detecting unit 60.

Upon receipt of a start signal, the mode changing unit 41 sends a signal for starting ignition to the ignition mode control unit 42. The ignition mode control unit 42 performs an ignition operation in response to the start signal.

The mode changing unit 41 monitors the output voltage Vo, and on the basis of the output voltage Vo, sends to the DC mode control unit 43 a change signal for changing from the ignition mode to the DC mode. The DC mode control unit 43 applies a certain level of the DC voltage to induce the discharge voltage state. After the DC mode, the mode changing unit 41 sends to the pulse mode control unit 44 a change signal for changing the mode to the pulse mode.

In the pulse mode control unit 44, the frequency control unit 44c uses the initial frequency fA of the initial frequency unit 44c1 to start the control of the pulse mode. The drive circuit 23 performs the ON/OFF operation in one cycle with the initial frequency fA.

Upon receipt of the change signal for the pulse mode, the cycle detecting unit 44a detects each cycle of the pulsing operation. The voltage evaluating unit 44b sends an instruction to the voltage evaluating unit 44b to evaluate the status of the charge of the capacitor every time the cycle detecting unit 44a detects the cycle of the pulsing operation. The voltage evaluating unit 44b evaluates for every cycle of the pulsing operation whether or not the capacitor voltage VC detected by the voltage detecting unit 60 reaches the set voltage or whether or not the voltage changed ΔVC as a difference between the capacitor voltage VC and the capacitor voltage VC in the previous cycle is greater than the set value.

When the capacitor voltage VC does not reach the set voltage or when the voltage change ΔVC exceeds the set value, the frequency control unit 44c uses the variable frequency fB of the variable frequency unit 44c2 to control the drive circuit 23. The variable frequency unit 44c2 gradually increases and updates the variable frequency fB cycle by cycle.

The variable frequency unit 44c2 adds or subtracts a value ΔDuty to or from the variable frequency fB in the previous cycle to update the variable frequency fB. For the first variable frequency fB, the initial frequency fA is used as the variable frequency in the previous cycle.

When the capacitor voltage VC reaches the set voltage or when the voltage change ΔVC does not exceed the set value, the frequency is changed from the variable frequency fB into the pulse mode frequency fPU of the steady stage, so as to use the pulse mode frequency fPU of the pulse mode frequency unit 44c3 to control the drive circuit 23.

(Configuration Example of DC Pulse Power Supply Device)

In the following, a description will now be made about the configuration example of the DC pulse power supply device. The pulsing unit of the DC pulse power supply device of the configuration example comprises the regeneration unit for regenerating the reactor voltage in the DC reactor. The regeneration unit has the capacitor connected in parallel to the DC reactor for regenerating the reactor voltage in the DC reactor. In addition to the regeneration of the reactor voltage in the DC reactor, the regeneration unit clamps the capacitor voltage in the capacitor and further clamps the reactor voltage in the DC reactor, which is connected in parallel to the capacitor, to the capacitor voltage, as well as the case of the voltage clamping unit 30c1.

A first configuration example is for regenerating a DC reactor voltage across the DC reactor of the step-up chopper circuit, and a second to fifth configuration examples are for regenerating the DC reactor voltage in one of two magnetically couple DC reactors of the step-up chopper circuit. The magnetically coupled two DC reactors of the second and fifth configuration examples are tapped autotransformers, and the magnetically coupled two DC reactors of the third and fourth configuration examples are multi-winding transformers. As to the voltage of the reactor to be regenerated, the first to fifth configuration examples use a voltage on a low-voltage side of the DC power supply as a reference voltage.

(First Configuration Example of DC Pulse Power Supply Device)

The first configuration example of the DC pulse power supply device of the present invention will be described by referring to FIG. 6.

The DC pulse power supply device of the invention comprises the DC power supply unit (DC unit) 10, a pulsing unit 20A that supplies to the load 5 with a pulse output generated by the step-up chopper circuit connected to the DC power supply unit 10, the regeneration unit 30 that regenerates a component of a voltage which rises excessively in the pulsing unit 20A to the DC power supply unit 10, the control circuit unit 40 that controls the DC power supply unit 10, the pulsing unit 20A, the drive circuit 23 and the regeneration unit 30, and the voltage detecting unit 60 that detects a capacitor voltage, the pulse output being supplied to the load 5 via an output cable 3. Although FIG. 6 shows an example of using the plasma generation device as the load 5, the load 5 is not limited to the plasma generation device and may be applied to an exciting of a pulse laser, an electrical discharge machine or similar.

(DC Power Supply Unit)

The DC power supply unit (DC unit) 10 comprises a rectifier 11 that rectifies an AC voltage in an AC power supply 2 to a DC voltage, a snubber circuit 12 that absorbs and suppresses a high voltage spike transiently generated during rectification, a single-phase inverter circuit 13 that changes the DC voltage into an AC voltage, a single-phase transformer 14 that transforms the AC voltage in the single-phase inverter circuit 13 to a predetermined voltage value, a rectifier 15 that rectifies the AC voltage transformed by the single-phase transformer 14 to a DC voltage, and a capacitor (CF) 16 in which a both-end voltage is a DC voltage of the DC power supply unit. One end of the capacitor 16 is grounded, and a negative low-voltage is produced at the other end thereof. The configuration in FIG. 6 shows a capacitive load of the plasma generation device as an example of the load 5. In this configuration, as one end of the plasma generation device is grounded to supply the negative voltage, the DC power supply unit 10 is configured to generate a pulse output of the negative voltage.

The single-phase inverter circuit 13 performs a switching operation in response to a control signal sent from the control circuit unit 40, so as to change the DC voltage into an AC voltage with a predetermined frequency. Each circuit element of the rectifiers 11, 15 the snubber circuit 12, the single-phase inverter circuit 13 and the single-phase transformer 14, which compose the DC power supply unit 10, may be any circuitry that is commonly known.

(Pulsing unit) The pulsing unit 20A generates a pulse waveform from the DC voltage by the step-up chopper circuit. The step-up chopper circuit comprises a DC reactor 21a connected in series between the DC power supply and the load, a switching element (Q1) 22 connected in parallel to the load, and the drive circuit 23 for controlling an ON/OFF operation of the switching element 22. The pulsing unit 20A is provided on its DC power supply side with a grounded terminal B and a terminal A of negative voltage as low-voltage side. The illustrated switching element 22 is an example of FET, in which a source side S is connected to the low-voltage side and a drain side D is connected to a grounded-voltage side, thereby inputting a drive signal from the drive circuit 23 to a gate side G.

The control circuit unit 40 generates a signal for setting a time width or duty ratio between an ON time and an OFF time of the switching element 22 with respect to a target pulse output in order to activate the step-up chopper circuit, as well as generating a control signal based on a voltage and current at the output end of the DC power supply unit 10.

The drive circuit 23 outputs the drive signal based on the control signal from the control circuit unit 40 to the gate G of the switching element 22, thereby making the switching element 22 to perform the ON/OFF operation.

The source S side of the switching element 22 is connected to the load side of the DC reactor 21a, and the drain D side of the switching element 22 is grounded. When the switching element 22 is in the ON state, the load side of the DC reactor 21a is grounded, and thereby a current flows from the terminal B to terminal A through the switching element 22 in the ON state and the DC reactor 21a. At this time, electromagnetic energy is accumulated in the DC reactor 21a. Then, when the switching element 22 is turned from the ON state to the OFF state, a reactor voltage VDCL is generated in the DC reactor 21a by the energy accumulated in the DC reactor 21a. By repeating the ON and OFF operations of the switching element 22, the step-up chopper circuit can boost an output voltage Vo according to the duty ratio of the ON and OFF times.

(Regeneration Unit)

The regeneration unit 30 regenerates to the DC power supply a component of the reactor voltage in the DC reactor of the step-up chopper circuit that exceeds the set voltage. The regeneration unit 30 comprises a diode 31, a capacitor (C1) 32, an inverter circuit 33, a transformer 34 and a rectifier 35.

One end of the capacitor (C1) 32 is connected to an end on the load side of the DC reactor 21a, and the other end is connected to another end on the DC power supply side of the DC reactor 21a via the diode 31, so that the reactor voltage generated in the DC reactor 21a is applied. A capacitor voltage VC1 of the capacitor (C1) 32 is defined on the basis of a DC voltage VAB of the DC power supply and a transformer ratio of the transformer, and when the transformer ratio of the transformer 34 is (n2:n1), the capacitor voltage VC1 is defined as a set voltage expressed by VC1=(n2/n1)×VAB. The diode 31 is connected in such a way that a direction from the pulsing unit 20A toward the capacitor (C1) 32 of the regeneration unit 30 is a forward direction, and when the reactor voltage VDCL of the DC reactor 21a exceeds the capacitor voltage VC1 of the capacitor (C1) 32, the regeneration unit 30 regenerates a component of the reactor voltage VDCL that exceeds the capacitor voltage VC1 of the capacitor (C1) 32. Thus, the regeneration unit 30 performs the regeneration operation by using the capacitor voltage VC1 of the capacitor (C1) 32 as a threshold value.

As to a method for defining the capacitor voltage VC1, there is a solution to vary the transformer ratio of the transformer 34 as well as controlling the output of the inverter circuit 33. Such solution can be, for example, PWM control or phase-shift control, but is not limited thereto and any solution that controls the output of the inverter circuit may be adopted.

Figure 6:
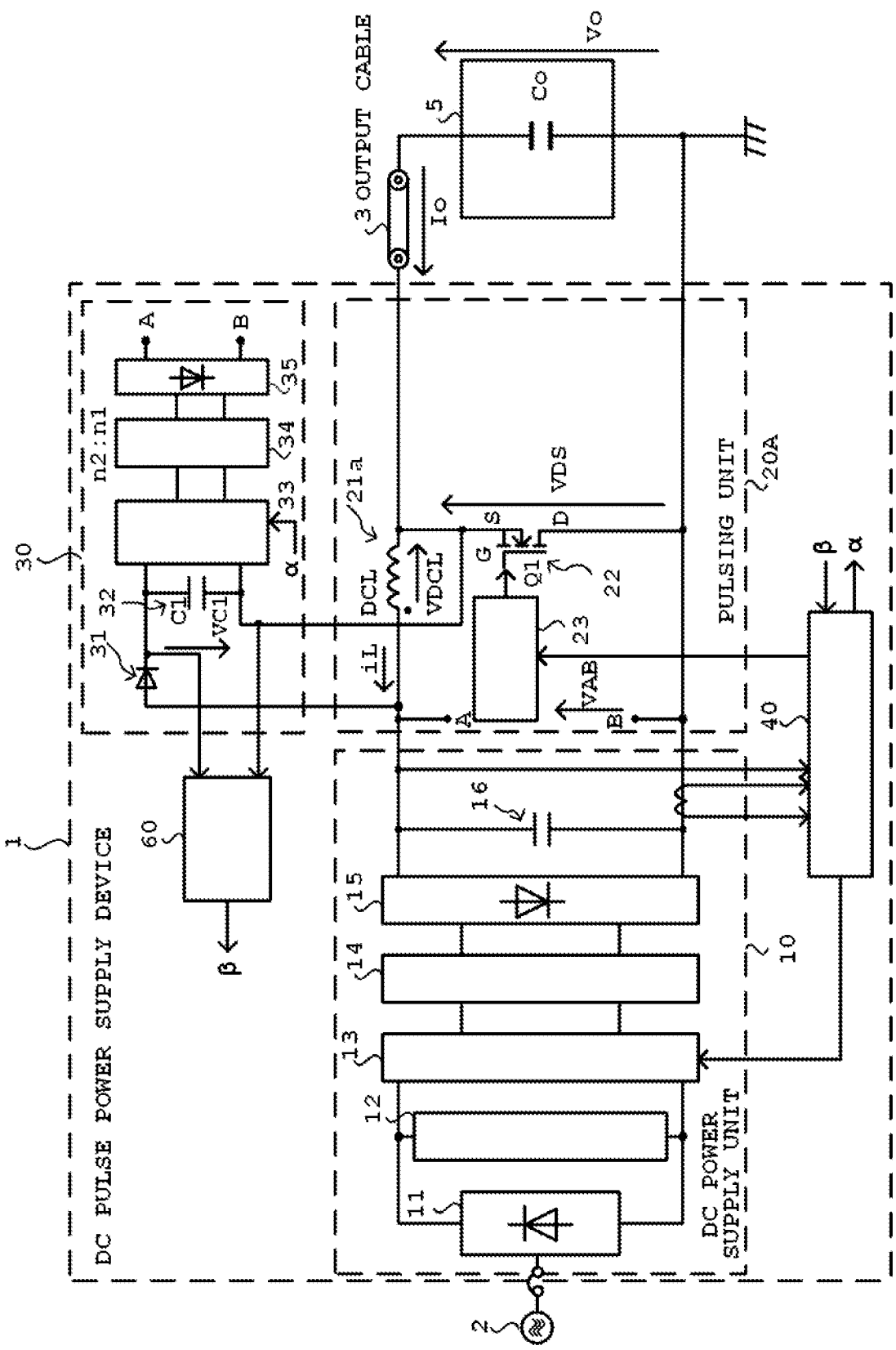
FIG. 6 illustrates a first configuration example of a DC pulse power supply of the invention.

Furthermore, in the circuitry shown in FIG. 6, the regeneration unit 30 is configured such that one end of the regeneration unit is connected to a low-voltage input end of the pulsing unit 20A, so as to regenerate the reactor voltage VDCL of the DC reactor 21a as the regeneration input voltage Vin based on a voltage on the low-voltage side (negative voltage).

The inverter circuit 33 performs orthogonal conversion between the DC voltage in the capacitor 32 and the AC voltage in the transformer 34, to thereby keep the capacitor voltage VC1 of the capacitor (C1) 32 to a constant voltage level based on the DC voltage VAB of the DC power supply, and when the reactor voltage VDCL exceeds the capacitor voltage VC1 of the capacitor (C1) 32, change the exceeded voltage component into an AC voltage to regenerate it to the DC power supply side. Since the capacitor voltage VC1 is maintained to the constant voltage level, the reactor voltage VDCL in the DC reactor 21a is clamped to the capacitor voltage VC1. The inverter circuit 33 can be configured with a bridge circuit of the switching element, by way of example. The switching element is open and closed by the control in response to a control signal a from the control circuit unit 40.

The transformer 34 modulates a voltage ratio between the DC voltage VAB of the DC power supply unit 10 and the capacitor voltage VC1 of the capacitor (C1) 32 based on the transformer ratio. When the transformer ratio of the transformer 34 is (n2:n1), the relationship of the voltages between the DC voltage VAB and the capacitor voltage VC1 can be represented by $VC1=(n2/n1)\times VAB$.

The rectifier 35 rectifies the AC voltage in the transformer 34 to the DC voltage in the DC power supply unit 10. The terminal on the DC side of the rectifier 35 is connected to the terminals A, B of the DC power supply unit 10, so that electric power is regenerated to the DC power supply unit 10 only when the capacitor voltage VC1 exceeds a voltage based on the DC voltage VAB.

The configuration of the regeneration unit 30 is not limited to the above-described one if the configuration includes a function of clamping the voltage across the DC reactor 21a to a predetermined voltage and a function of regenerating a component of electric power exceeding the predetermined voltage to the DC power supply.

(Configuration Example of Regeneration Unit)

Figure 7:
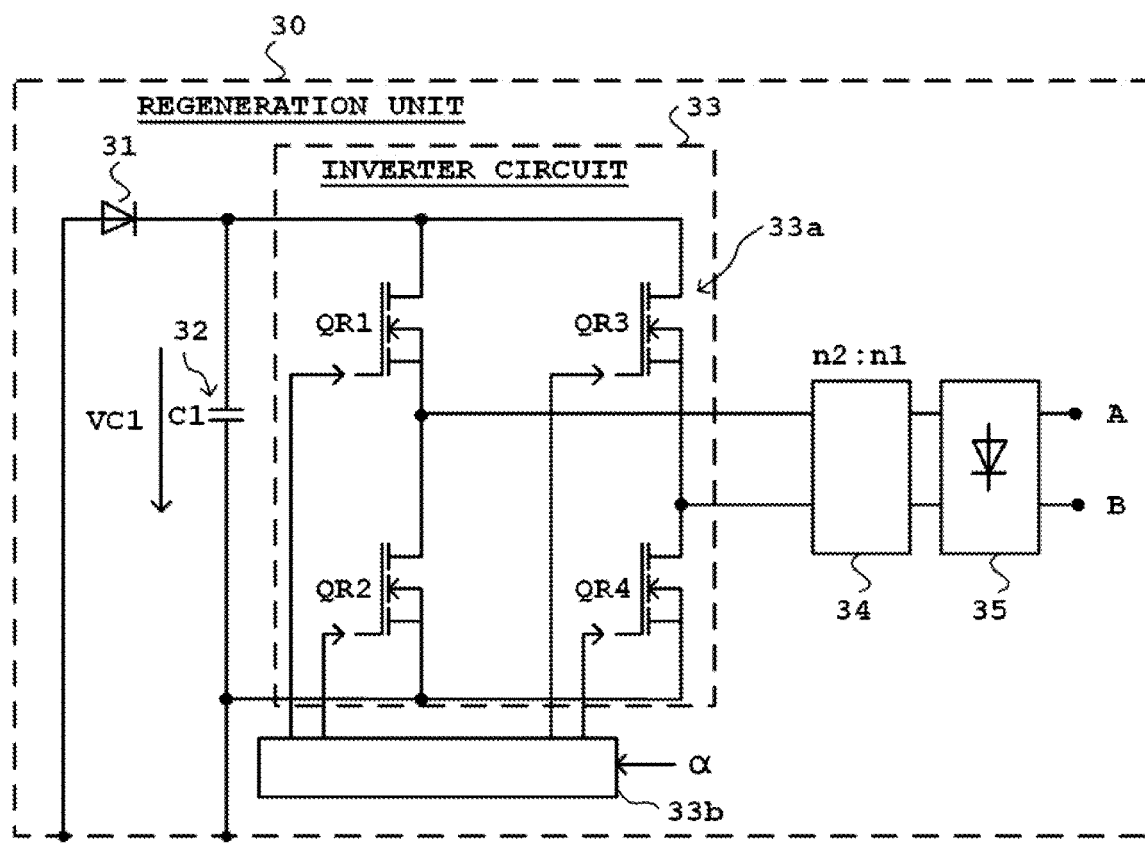
FIG. 7 illustrates a circuitry example of an inverter circuit included in a regeneration unit of the DC pulse power supply device of the invention.

Referring to FIG. 7, a description will be made about the circuitry of the inverter circuit included in the regeneration unit of the DC pulse power supply device.

The regeneration unit 30 includes the inverter circuit 33 that outputs to the transformer 34 an AC voltage obtained by performing orthogonal transformation on the DC voltage of the capacitor voltage VC1 in the capacitor (C1) 32. The inverter circuit 33 comprises a bridge circuit 33a consisting of switching elements QR1 to QR4, and a drive circuit 33b that generates drive signals for driving the switching elements QR1 to QR4 based on a control signal a. In here, a full-bridge circuit is used as an example of the bridge circuit 33a, but the circuit 33a may be a half-bridge circuit or multi-phase inverter circuit.

(Second Configuration of DC Pulse Power Supply Device)

Figure 8:
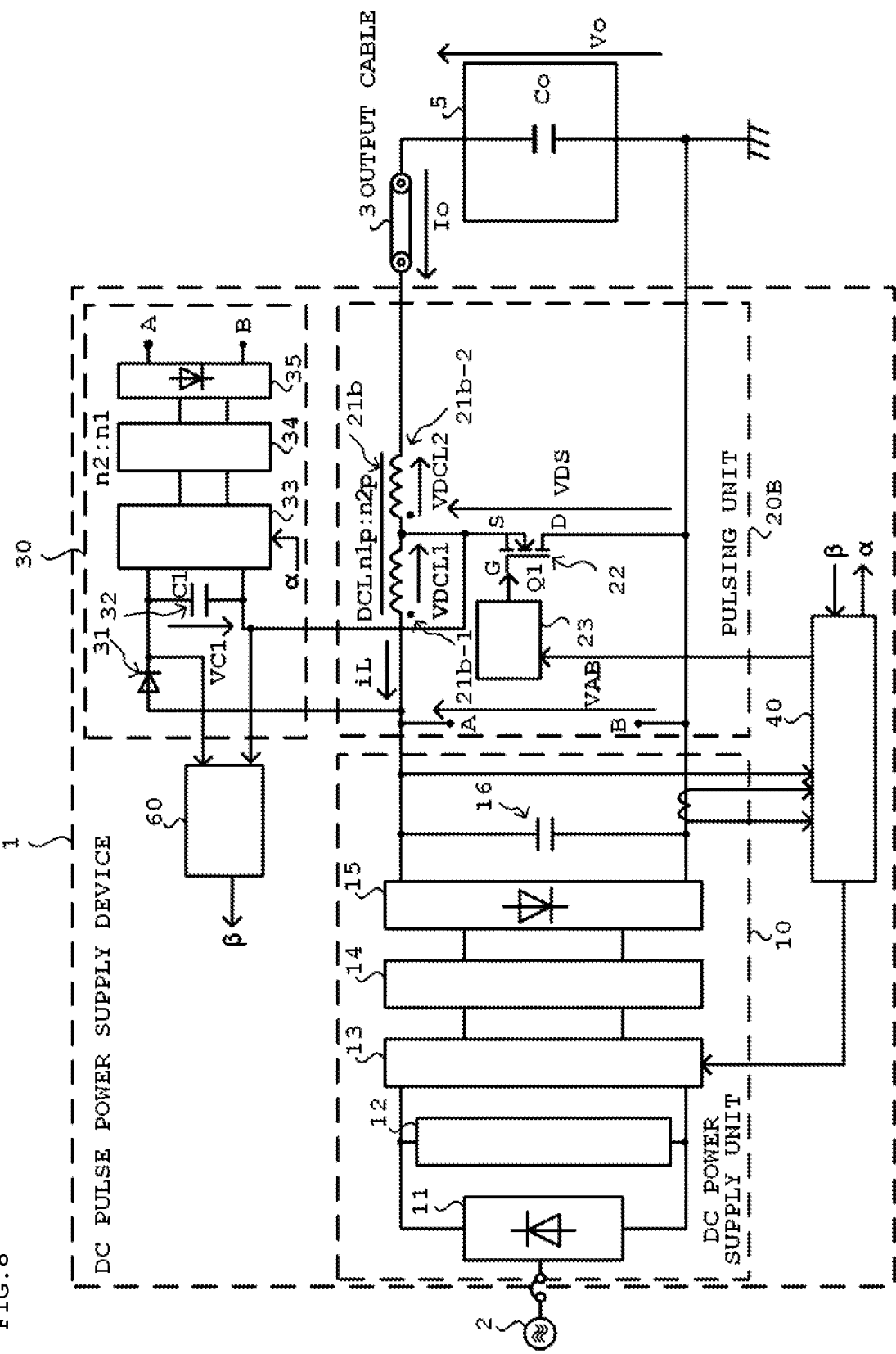
FIG. 8 illustrates a second configuration example of the DC pulse power supply of the invention.

A second configuration example of the DC pulse power supply device of the present invention will be described by referring to FIG. 8. The second configuration example is different from the first configuration example in the step-up chopper circuit in the pulsing unit 20, and is the same as the first configuration example in the other constituent elements. Next, a description will be made about the constituent element that differs from that of the first configuration example, and the description about the other common elements will be omitted.

The DC reactor 21a included in the step-up chopper circuit of the first configuration example is composed of a single coil. By contrast, the DC reactor 21b of the second configuration example is composed of a tapped autotransformer, instead of the single coil of the step-up chopper circuit of the first configuration example. The DC reactor 21b of the tapped autotransformer can be configured by connecting magnetically coupled first DC reactor 21b-1 and second DC reactor 21b-2 in series, and a connection point between the first DC reactor 21b-1 and the second DC reactor 21b-2 is used as a tapping point. One end of the first DC reactor 21b-1 is connected to the terminal A on the low-voltage side of the DC power supply, whereas one end of the second DC reactor 21b-2 is connected to the load side, and the tapping point of the connection point between the first DC reactor 21b-1 and the second DC reactor 21b-2 is connected to the source S of the switching element 22.

When the switching element 22 is in the ON state, the tapping point of the connection point of the DC reactor 21b is grounded, thereby flowing a current from the terminal B to the terminal A via the switching element 22 in the ON state and the first DC reactor 21b-1 of the DC reactor 21b. At this time, electromagnetic energy is accumulated in the first DC reactor 21b-1.

Then, when the switching element 22 is turned from the ON state to the OFF state, the DC reactor current iDCL flown by the energy accumulated in the first DC reactor 21b-1 of the DC reactor 21b causes the generation of a reactor voltage VDCL1 in the first DC reactor 21b-1 and a reactor voltage VDCL2 in the second DC reactor 21b-2. The step-up chopper circuit repeatedly changes the ON operation and the OFF operation of the switching element 22, so as to boost the output voltage Vo as with the case of the first configuration example.

The voltage ratio between the reactor voltage VDCL1 of the first DC reactor 21b-1 and the reactor voltage VDCL2 of the second DC reactor 21b-2 corresponds to an inductance ratio between the first DC reactor 21b-1 and the second DC reactor 21b-2. When a turns ratio of the tapped single-turning coils of the first DC reactor 21b-1 and second DC reactor 21b-2 of the DC reactor 21b is n1p:n2p, the voltage ratio (VDCL1/VDCL2) between the reactor voltage VDCL1 of the first DC reactor 21b-1 and the reactor voltage VDCL2 of the second DC reactor 21b-2 stands at the turns ratio of (n1p/n2p).

The regeneration unit 30 in the second configuration example performs in the same way as that of the first configuration example by applying the reactor voltage VDCL1 of the first DC reactor 21b-1 of the DC reactor 21b, instead of the reactor voltage VDCL of the DC reactor 21a in the first configuration example.

In the regeneration unit 30, one end of the capacitor (C1) 32 is connected to the connection point between the first DC reactor 21b-1 and second DC reactor 21b-2 of the DC reactor 21b, whereas the other end thereof is connected to the end on the DC power supply side of the first DC reactor 21b-1 via the diode 31, thereby applying the reactor voltage VDCL1 generated in the first DC reactor 21b-1. The capacitor voltage VC1 of the capacitor (C1) 32 is defined on the basis of the DC voltage VAB of the DC power supply and the transformer ratio of the transformer 34, and when the transformer ratio of the transformer 34 is (n2:n1), the capacitor voltage VC1 is defined as a set voltage expressed by $VC1=(n2/n1)\times VAB$. The diode 31 is connected such that a direction from the pulsing unit 20B toward the capacitor (C1) 32 of the regeneration unit 30 is a forward direction, and when the reactor voltage VDCL1 in the first DC reactor 21b-1 exceeds the capacitor voltage VC1 in the capacitor (C1) 32, the regeneration unit 30 regenerates a component of the reactor voltage VDCL1 that exceeds the capacitor voltage VC1 of the capacitor (C1) 32. In this way, the regeneration unit 30 performs the regeneration operation by using the capacitor voltage VC1 in the capacitor (C1) 32 as a threshold value, as with the case of the first configuration example.

As the output voltage Vo, output is a voltage (Vo=VAB+VDCL1+VDCL2) obtained by superimposing the reactor voltage VDCL1 of the first DC reactor 21b-1 and the reactor voltage VDCL2 of the second DC reactor 21b-2 on the DC voltage VAB of the DC power supply. Since the reactor voltage VDCL1 of the first DC reactor 21b-1 is clamped to the capacitor voltage VC1, the output voltage Vo stands at Vo=VAB+VC1+VDCL2.

(Third Configuration of DC Pulse Power Supply Device)

Figure 9:
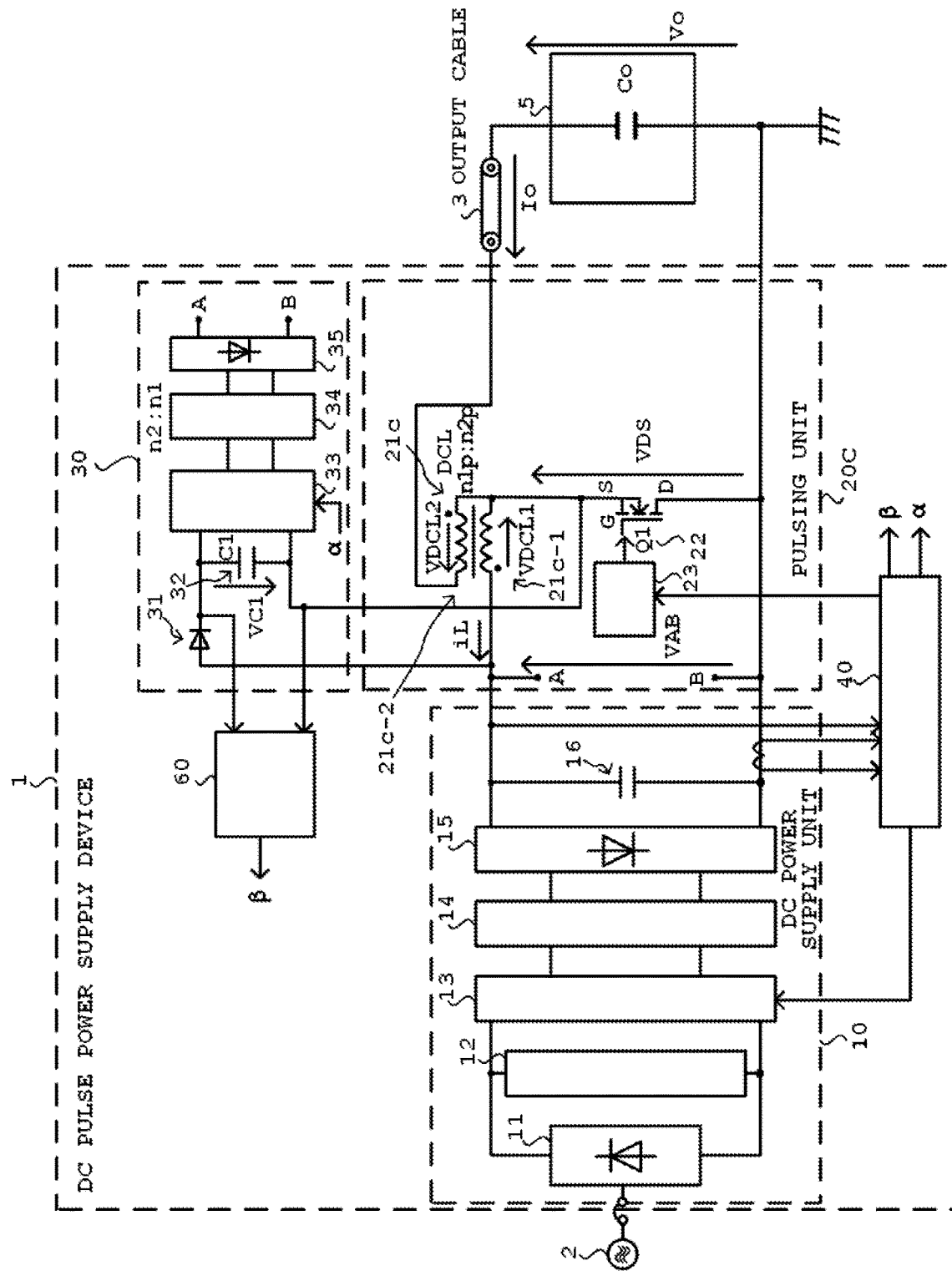
FIG. 9 illustrates a third configuration example of the DC pulse power supply of the invention.

A description will now be made about a third configuration example of the DC pulse power supply device of the invention by referring to FIG. 9. The third configuration example is different from the first and second configuration examples in a step-up chopper circuit in a pulsing unit 20C, and is the same as the first and second configuration examples in the other constituent elements. Next, a description will be made about the constituent element that differs from those of the first and second configuration examples, and the description about the other common elements will be omitted.

The DC reactor 21*b* included in the step-up chopper circuit of the second configuration example is composed of a tapped autotransformer. By contrast, a DC reactor 21*c* of the third configuration example is composed of a multi-winding transformer, instead of the tapped autotransformer of the step-up chopper circuit of the second configuration example. The multi-winding transformer of the DC reactor 21*c* is an example of an additive polarity transformer.

The DC reactor 21*c* of the multi-winding transformer is configured by connecting magnetically coupled first DC reactor 21*c*-1 and second DC reactor 21*c*-2 in parallel. One end of the first DC reactor 21*c*-1 is connected to the terminal A on the low-voltage side of the DC power supply, and the other end thereof is connected to the end of the source S of the switching element 22. One end of the second DC reactor 21*c*-2 is connected to the end of the source S of the switching element 22, and the other end is connected to the load side.

When the switching element 22 is in the ON state, the end on the switching element 22 of the first DC reactor 21*c*-1 of the DC reactor 21*c* is grounded, so that a current flows from the terminal B to the terminal A through the switching element 22 in the ON state and the first DC reactor 21*c*. At this time, electromagnetic energy is accumulated in the first DC reactor 21*c*.

Then, when the switching element 22 is turned from the ON state to the OFF state, the DC reactor current iDCL flown by the energy accumulated in the first DC reactor 21*c*-1 of the DC reactor 21*c* causes the generation of the reactor voltage VDCL1 in the first DC reactor 21*c*-1, and the electromagnetic coupling of the second DC reactor 21*c*-2 with the first DC reactor 21*c*-1 causes the generation of the reactor voltage VDCL2 in the second DC reactor 21*c*-2. The step-up chopper circuit repeatedly changes the ON operation and the OFF operation of the switching element 22, so as to boost the output voltage Vo as with the case of the first and second configuration examples.

A voltage ratio between the reactor voltage VDCL1 of the first DC reactor 21*c*-1 and the reactor voltage VDCL2 of the second DC reactor 21*c*-2 stands at a value corresponding to an inductance ratio between the first DC reactor 21*c*-1 and the second DC reactor 21*c*-2. When a turns ratio of the multi-turning coils of the first DC reactor 21*c*-1 and second DC reactor 21*c*-2 of the DC reactor 21*c* is (n1$p$:n2$p$), the voltage ratio (VDCL1/VDCL2) between the reactor voltage VDCL1 of the first DC reactor 21*c*-1 and the reactor voltage VDCL2 of the second DC reactor 21*c*-2 stands at the turns ratio of (n1$p$/n2$p$).

The regeneration unit of the third configuration example performs in the way similar to the case in the regeneration unit for the reactor voltage VDCL1 of the first DC reactor 21*b*-1 of the DC reactor 21*b* of the second configuration example.

In the regeneration unit 30, one end of the capacitor (C1) 32 is connected to an end on the switching element side of the first DC reactor 21*c*-1 of the DC reactor 21*c* and the other end is connected to another end on the DC power supply side of the first DC reactor 21*c*-1 via the diode 31, so as to apply the reactor voltage VDCL1 generated in the first DC reactor 21*c*-1. The capacitor voltage VC1 in the capacitor (C1) 32 is defined on the basis of the DC voltage VAB of the DC power supply and the transformer ratio of the transformer, and when the transformer ratio of the transformer 34 is (n2:n1), the capacitor voltage VC1 defined as a set voltage expressed by VC1=(n2/n1)×VAB. The diode 31 is connected such that a direction from the pulsing unit toward the capacitor (C1) 32 of the regeneration unit 30 is a forward direction, and when the DC reactor voltage VDCL1 of the first DC reactor 21*c*-1 exceeds the capacitor voltage VC1 of the capacitor (C1) 32, the regeneration unit 30 regenerates a component of the reactor voltage VDCL1 that exceeds the capacitor voltage VC1 of the capacitor (C1) 32. In this way, the regeneration unit 30 performs the regeneration operation by using the capacitor voltage VC1 of the capacitor (C1) 32 as a threshold value, as with the cases of the first and second configuration examples.

As the output voltage Vo, output is a voltage (Vo=VAB+ VDCL1+VDCL2) obtained by superimposing the reactor voltage VDCL1 of the first DC reactor 21*c*-1 and the reactor voltage VDCL2 of the second DC reactor 21*c*-2 on the DC voltage VAB of the DC power supply. Since the reactor voltage VDCL1 of the first DC reactor 21*c*-1 is clamped to the capacitor voltage VC1, the output voltage Vo is Vo=VAB+VC1+VDCL2. When a turns ratio of the first DC reactor 21*c*-1 and the second DC reactor 21*c*-2 is (n1$p$/n2$p$), the reactor voltage VDCL1 and the reactor voltage VDCL2 are represented by (VDCL1/VDCL2=n1$p$/n2$p$).

(Fourth Configuration of DC pulse power supply device)

Figure 10:
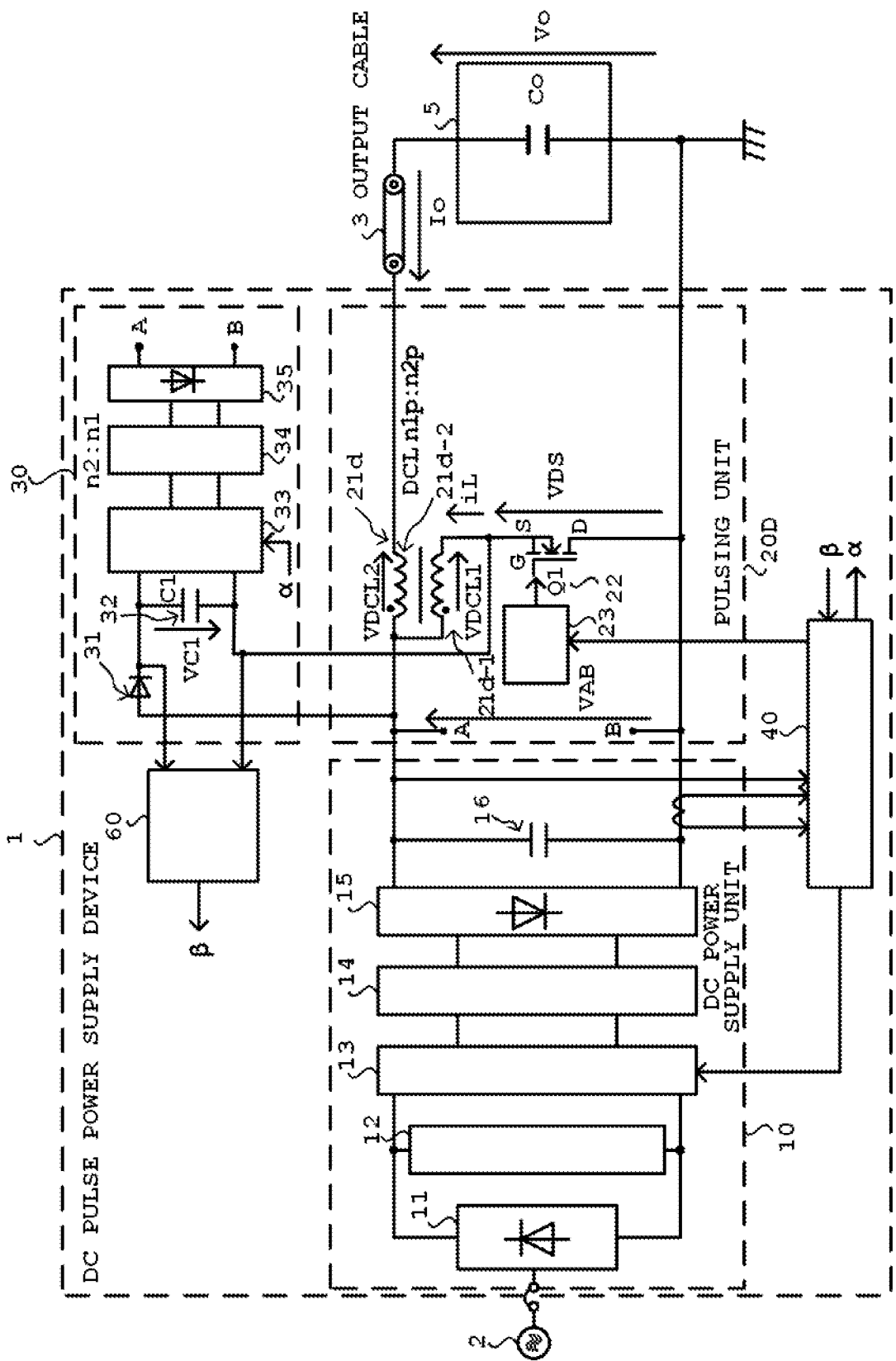
FIG. 10 illustrates a fourth configuration example of the DC pulse power supply of the invention.

A description will now be made about a fourth configuration example of the DC pulse power supply device of the invention by referring to FIG. 10. The fourth configuration example is different from the third configuration example in the transformer that constitutes the DC reactor of the step-up chopper circuit in a pulsing unit 20D, and is the same as the third configuration example in the other constituent elements.

The DC reactor 21*c* included in the step-up chopper circuit of the third configuration example is composed of the multi-winding transformer with the additive polarity. By contrast, the DC reactor 21*d* of the fourth configuration example is composed of a multi-winding transformer with a subtractive polarity, instead of the multi-winding transformer with the additive polarity of the step-up chopper circuit of the third configuration example.

The DC reactor 21*d* of the multi-winding transformer is configured by connecting magnetically coupled first DC reactor 21*d*-1 and second DC reactor 21*d*-2 in parallel. One end of the first DC reactor 21*d*-1 is connected to the terminal A on the low-voltage side of the DC power supply, and the other end thereof is connected to the source S of the switching element 22. One end of the second DC reactor 21*d*-2 is connected to the terminal A on the low-voltage side of the DC power supply, and the other end is connected to the load side.

When the switching element 22 is in the ON state, the end on the switching element 22 side of the first DC reactor 21*d*-1 of the DC reactor 21*d* is grounded, so that a current flows from the terminal B to the terminal A through the switching element 22 in the ON state and the first DC reactor 21*d*-1. At this time, electromagnetic energy is accumulated in the first DC reactor 21*d*-1.

Then, when the switching element 22 is turned from the ON state to the OFF state, the DC reactor current iDCL flown by the energy accumulated in the first DC reactor 21*d*-1 of the DC reactor 21*d* causes the generation of the reactor voltage VDCL1 in the first DC reactor 21*d*-1, and the electromagnetic coupling of the second DC reactor 21*d*-2 with the first DC reactor 21*d*-1 causes the generation of the reactor voltage VDCL2 in the second DC reactor 21*d*-2. The step-up chopper circuit repeatedly changes the ON operation and the OFF operation of the switching element 22, so as to boost the output voltage Vo as with the cases of the first, second and third configuration examples.

A voltage ratio between the reactor voltage VDCL1 of the first DC reactor 21*d*-1 and the reactor voltage VDCL2 of the second DC reactor 21*d*-2 stands at a value corresponding to an inductance ratio between the first DC reactor 21*d*-1 and the second DC reactor 21*d*-2. When a turns ratio of the multi-turning coils of the first DC reactor 21*d*-1 and second DC reactor 21*d*-2 of the DC reactor 21*d* is (n1*p*:n2*p*), the voltage ratio (VDCL1/VDCL2) between the reactor voltage VDCL1 of the first DC reactor 21*d*-1 and the reactor voltage VDCL2 of the second DC reactor 21*d*-2 stands at the turns ratio of (n1*p*/n2*p*).

The DC reactor 21*d* of the regeneration unit of the fourth configuration example performs in the way similar to the case of the DC reactor 21*c* for the reactor voltage VDCL1 of the first DC reactor 21*c* of the third configuration example In the regeneration unit 30, one end of the capacitor (C1) 32 is connected to an end on the switching element side of the first DC reactor 21*d*-1 of the DC reactor 21*d* and the other end is connected to an end on the DC power supply side of the first DC reactor 21*d*-1 via the diode 31, so as to apply the reactor voltage VDCL1 generated in the first DC reactor 21*d*-1. The capacitor voltage VC1 in the capacitor (C1) 32 is defined on the basis of the DC voltage VAB of the DC power supply and the transformer ratio of the transformer, and when the transformer ratio of the transformer 34 is (n2:n1), the capacitor voltage VC1 is defined as a set voltage represented by VC1=(n2/n1)×VAB. The diode 31 is connected such that a direction from the pulsing unit toward the capacitor (C1) 32 of the regeneration unit 30 is a forward direction, and when the reactor voltage VDCL1 of the first DC reactor 21*d*-1 exceeds the capacitor voltage VC1 of the capacitor (C1) 32, the regeneration unit 30 regenerates a component of the reactor voltage VDCL1 that exceeds the capacitor voltage VC1 of the capacitor (C1) 32. In this way, the regeneration unit 30 performs the regeneration operation by using the capacitor voltage VC1 of the capacitor (C1) 32 as a threshold value, as with the cases of the first, second and third configuration example.

As the output voltage Vo, output is a voltage (Vo=VAB+VDCL2) obtained by superimposing the reactor voltage VDCL2 of the second DC reactor 21*d*-2 on the DC voltage VAB of the DC power supply. When a turns ratio of the first DC reactor 21*d*-1 and the second DC reactor 21*d*-2 is (n1*p*/n2*p*), the reactor voltages VDCL1 and VDCL2 are represented by (VDCL1/VDCL2=n1*p*/n2*p*). Thus, when the voltage VDCL1 is clamped to the voltage VC1, the output voltage Vo stands at Vo=VAB+VC1×(n1*p*/n2*p*).

(Fifth Configuration of DC Pulse Power Supply Device)

Figure 11:
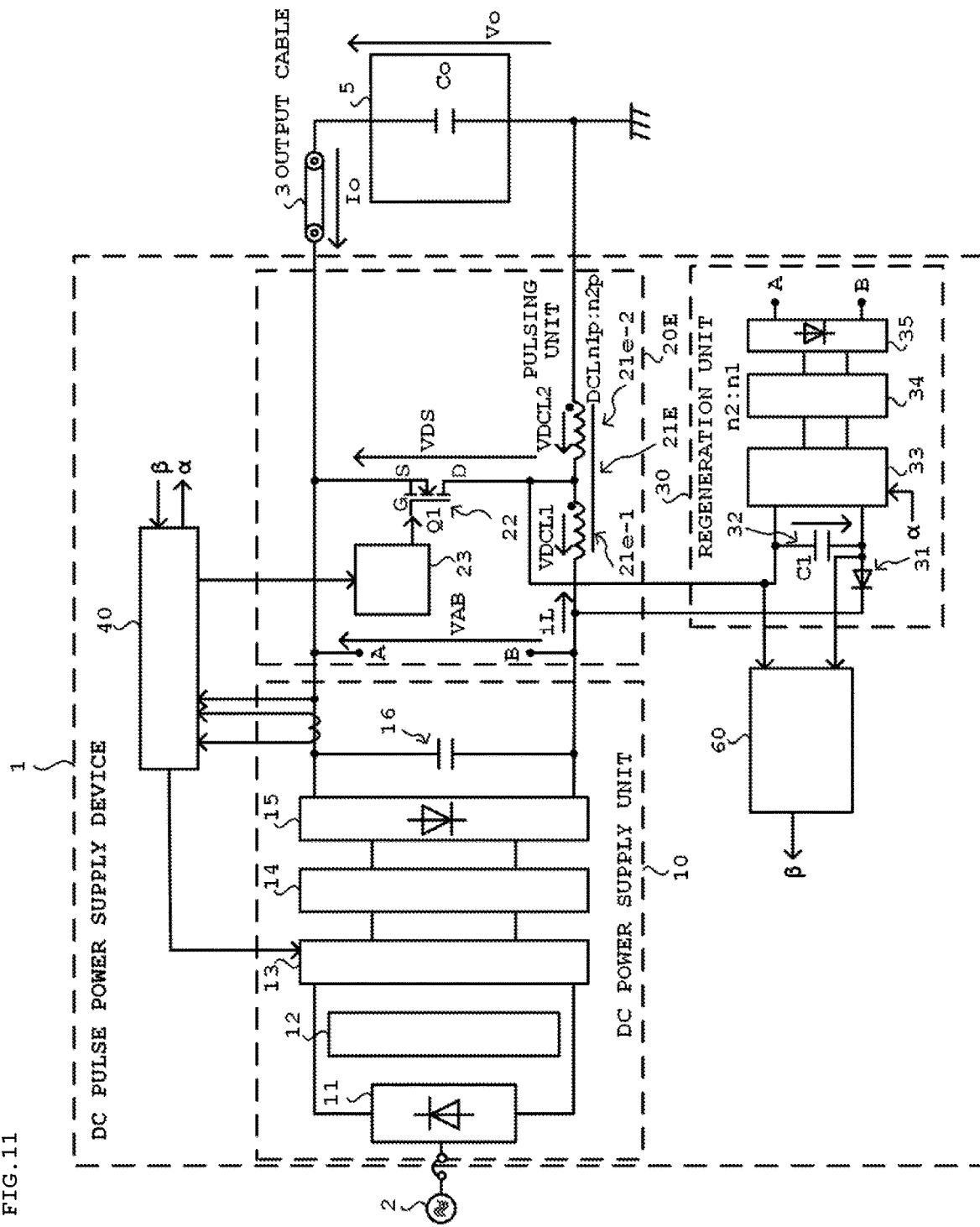
FIG. 11 illustrates a fifth configuration example of the DC pulse power supply of the invention.
Figure 12:
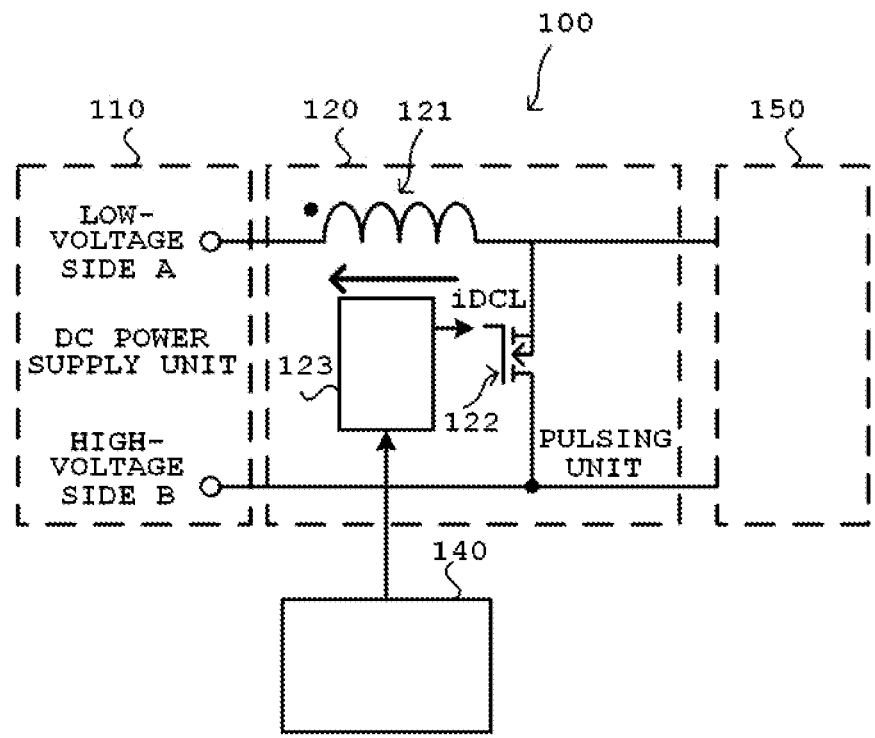
FIG. 12 illustrates a configuration example of a conventional DC pulse power supply device.
Figure 13:
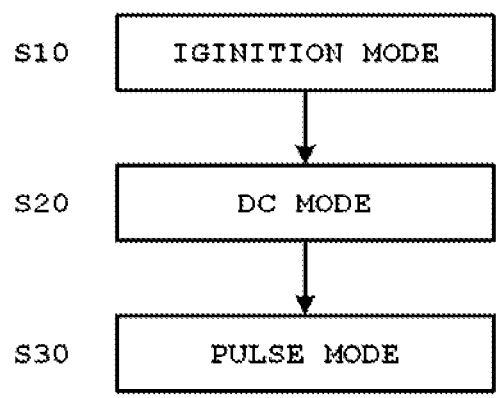
FIG. 13 is a schematic flowchart illustrating each mode for supplying a pulse output from the DC pulse power supply device to a plasma load.
Figure 14A:
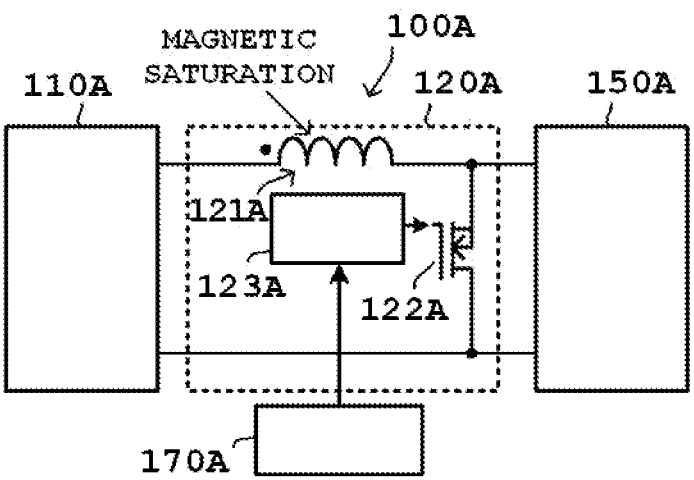
FIGS. 14(a) to 14(c) illustrate magnetic saturation of a DC reactor.
Figure 14B:
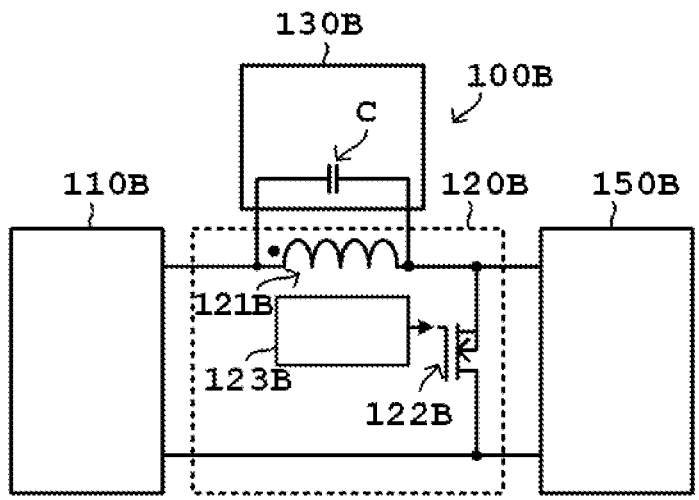
Figure 14C:
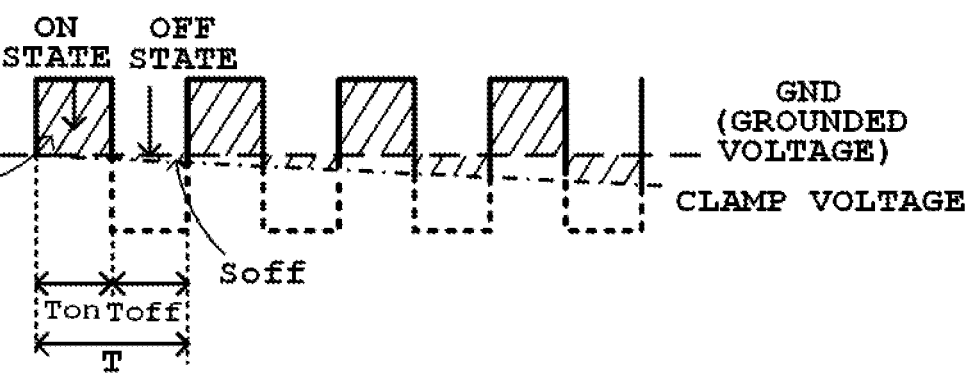

A description will be made about a fifth configuration example of the DC pulse power supply device of the present invention by referring to FIG. 11. The fifth configuration example is different from the second configuration example in the arrangement of the DC reactor of the step-up chopper circuit, and is the same as the second configuration example in the other constituent elements. In the following, the difference from the second configuration example will be described, and the description about the other common elements will be omitted.

A DC reactor 21*e* included in the step-up chopper circuit of the fifth configuration example is composed of a trapped autotransformer, as with the DC reactor 21*b* of the step-up chopper circuit of the second configuration example, but is different in its arrangement with respect to a power line. The DC reactor 21*b* of the second configuration example is connected to a power line on the low-voltage side of the DC power supply, whereas a DC reactor 21*e* of the fifth configuration example is connected to a power line on the high-voltage side of the DC power supply.

In the pulsing unit 20E, the DC reactor 21*e* of the tapped autotransformer is configured by connecting magnetically couple first DC reactor 21*e*-1 and second DC reactor 21*e*-2 in series, and uses a connection point between the first DC reactor 21*e*-1 and the second DC reactor 21*e*-2 as tapping point. One end of the first DC reactor 21*e*-1 is connected to the terminal B on the high-voltage side of the DC power supply, and one end of the second DC reactor 21*e*-2 is connected to the load side and further grounded. The tapping point of the connection point of the first DC reactor 21*e*-1 and the second DC reactor 21*e*-2 is connected to the end of the drain D of the switching element 22.

When the switching element 22 is in the ON state, the tapping point of the connection point of the DC reactor 21*e* is grounded via the second DC reactor 21*e*-2, so that a current can flow from the terminal B to the terminal A through the first DC reactor 21*e*-1 and the switching element 22 in the ON state.

At this time, electromagnetic energy in the first DC reactor 21*e*-1 is accumulated.

Then, when the switching element 22 is turned from the ON state to the OFF state, the DC reactor current iDCL flown by the accumulated energy in the first DC reactor 21*e*-1 of the DC reactor 21*e* causes the generation of the reactor voltage VDCL1 in the first DC reactor 21*e*-1, while causing the generation of the reactor voltage VDCL2 in the second DC reactor 21*e*-2. The step-up chopper circuit repeatedly changes the ON operation and the OFF operation of the switching element 22, so as to boost the output voltage Vo as with the case of the first configuration example.

A voltage ratio between the reactor voltage VDCL1 of the first DC reactor 21*e*-1 and the reactor voltage VDCL2 of the second DC reactor 21*e*-2 stands at a value corresponding to an inductance ratio between the first DC reactor 21*e*-1 and the second DC reactor 21*e*-2. When a turns ratio of a tapped single-winding coils of the first DC reactor 21*e*-*l* and the second DC reactor 21*e*-2 of the DC reactor 21 is n1*p*:n2*p*, the voltage ratio (VDCL1/VDCL2) between the reactor voltage VDCL1 of the first DC reactor 21*e*-1 and the reactor voltage VDCL2 of the second DC reactor 21*e*-2 stands at the turns ratio of (n1*p*/n2*p*).

The regeneration unit 30 of the fifth configuration example can perform in the manner similar to the case in the first configuration example by employing the reactor voltage VDCL1 of the first DC reactor 21*e*-1 of the DC reactor 21*e* instead of the reactor voltage VDCL of the DC reactor 21*a* of the first configuration example.

In the regeneration unit 30, one end of the capacitor (C1) 32 is connected to the connection point between the first DC reactor 21*e*-1 and second DC reactor 21*e*-2 of the DC reactor 21*e* and the other end is connected to the end on the DC power supply side of the first DC reactor 21*e*-1 via the diode 31, thereby applying the reactor voltage VDCL1 generated in the first DC reactor 21*e*-1. The capacitor voltage VC1 of the capacitor (C1) 32 is defined based on the DC voltage VAB of the DC power supply and the transformer ratio of the transformer, and when the transformer ratio of the transformer 34 is (n2:n1), the capacitor voltage VC1 is defined as a set voltage expressed by VC1=(n2/n1)×VAB. The diode 31 is connected such that a direction from the pulsing unit 20D toward the capacitor (C1) 32 of the regeneration unit 30 is a reversed direction, and when the reactor voltage VDCL1 of the first DC reactor 21*e*-1 exceeds the capacitor voltage VC1 of the capacitor (C1) 32, the regeneration unit 30 regenerates a component of the reactor voltage VDCL1 that exceeds the capacitor voltage VC1 of the capacitor (C1) 32. Thus, the regeneration unit 30 performs the regeneration operation by using the capacitor voltage VC1 of the capacitor (C1) 32 as a threshold value, as with the case of the first configuration example.

As the output voltage Vo, output is a voltage (Vo=VAB+VDCL1+VDCL2) obtained by superimposing the reactor voltage VDCL1 of the first DC reactor 21e-1 and the reactor voltage VDCL2 of the second DC reactor 21e-2 on the DC voltage VAB of the DC power supply. Since the reactor voltage VDCL1 of the first DC reactor 21e-1 is clamped to the capacitor voltage VC1, the output voltage Vo stands at Vo=VAB+VC1+VDCL2.

In the DC pulse power supply device according to the first configuration example to the fifth configuration example, the control circuit unit 40 comprises the pulse mode control unit that controls the pulsing operation in the pulse mode for generating the pulse output in a certain cycle, the pulse mode control unit comprising the frequency control unit that makes the frequency variable. The frequency control unit makes the frequency variable in the initial stage of the pulsing operation to prevent the occurrence of the magnetic saturation in the initial stage of the pulse mode.

Furthermore, the voltage at the S terminal of the switching element is clamped to a voltage lower than the surge voltage to prevent the excessive rise in the voltage applied to the switching element, and the frequency control performed by the pulse mode control unit resets the magnetic saturation of the DC reactors 21a to 21e.

The description about the above embodiments and modifications are examples of the DC pulse power supply device in accordance with the present invention. The present invention is therefore not limited to the above embodiments and can be changed or modified in various ways on the basis of the ideas of the invention, and these variations are not excluded from the scope of the invention.

INDUSTRIAL APPLICABILITY

The DC pulse power supply device of the present invention can be applied as power supply for supplying electric power to a plasma generation device, and furthermore can be used as power supply device for supplying a pulse output to, for instance, a load for exciting a pulse laser, or of an electric discharge machine.

REFERENCE SIGNS LIST

1 DC Pulse Power Supply
2 AC Power Supply
3 Output Cable
5 Load
10 DC Power Supply Unit
11 Rectifier
12 Snubber Circuit
13 Single-Phase Inverter Circuit
14 Single-Phase Transformer
15 Rectifier
16 Capacitor
20, 20A, 20B, 20C, 20D Pulsing Unit
21, 21a, 12b, 21c, 21d, 21e DC Reactor
22 Switching Element
23 Drive Circuit
30 Regeneration Unit
30c1 Voltage Clamping Unit
31 Diode
32 Capacitor
33 Inverter Circuit
33a Bridge Circuit
33b Drive Circuit
34 Transformer
35 Rectifier
40 Control Circuit Unit
41 Mode Changing Unit
42 Ignition Mode Control unit
43 DC Mode Control unit
44 Pulse Mode Control unit
44a Cycle Detecting Unit
44b Voltage Evaluating Unit
44c Frequency Control unit
44c1 Initial Frequency Unit
44c2 Variable Frequency Unit
44c3 Pulse Mode Frequency Unit
50 Load
60 Voltage Detecting Unit
100 DC Pulse Power Supply Device
110 DC Power Supply Unit
120 Pulsing Unit
120A Pulsing Unit
121, 121A, 121B DC Reactor
122, 122A, 122B Switching Element
123 Drive Circuit
130 Voltage Clamping Unit
140 Control Circuit Unit
150 Load
C Capacitor
D Drain
G Gate
QR1-QR4 Switching Element
S Source
Soff Voltage-Time Product
Son Voltage-Time Product
T Time Width
TA Time Width
TB Time Width
TPU Time Width
Tfix Fixed Time Width
Toff Time Width
ToffA Initial Value
ToffB Time Width
Ton Time Width
TonA Initial Value
TonB Time Width
Tva Variable Time Width
TAB DC voltage
VC Capacitor Voltage
VC1 Capacitor Voltage
VDCL Reactor Voltage
VDCL1 Reactor Voltage
VDCL2 Reactor Voltage
Vin Regeneration Input Voltage
Vo Output Voltage
fA Initial Frequency
fB Variable Frequency
fPU Pulse Mode Frequency
iDCL DC Reactor Current
ΔVC Voltage Change
α Control Signal

The invention claimed is:

1. A DC pulse power supply device, comprising:
   a DC power supply;
   a pulsing unit that is connected to the DC power supply to generate a pulse output by a step-up chopper circuit comprising a series circuit composed of a DC reactor and a switching element;
   a voltage clamping unit that comprises a capacitor connected in parallel to the DC reactor of the pulsing unit, and uses a capacitor voltage in the capacitor to clamp a voltage across the DC reactor to a clamp voltage; and
   a control circuit unit that controls a switching operation of the switching element of the pulsing unit, wherein
   the control circuit unit comprises a pulse mode control unit that controls a pulsing operation in a pulse mode for generating the pulse output, in which
   the pulse mode control unit comprises a frequency control unit that makes a frequency variable, in which
   the frequency control unit performs, in an initial stage of the pulsing operation in multiple cycles, the pulsing operation with a variable frequency that makes the frequency of the pulsing operation variable by gradually increasing or gradually decreasing a time width in each cycle, so as to reset magnetic saturation of the DC reactor.

2. The DC pulse power supply device according to claim 1, in each of multiple cycles in the initial stage of the pulsing operation of the frequency control unit, wherein
   the pulsing operation with the variable frequency is for fixing a time width in an ON period during which the switching element is closed to pass a current through the DC reactor, while gradually decreasing a time width in an OFF period during which the switching element is open to perform clamping on the DC reactor based on a capacitor voltage.

3. The DC pulse power supply device according to claim 1, wherein the frequency control unit performs in a steady stage of the pulsing operation, subsequent to the initial stage:
   the pulsing operation with a steady frequency in which the time width in each cycle is fixed; and
   changing of the frequency from the variable frequency to the steady frequency based on the capacitor voltage in the capacitor or a voltage change of the capacitor voltage.

4. The DC pulse power supply device according to claim 3, wherein the pulse mode control unit comprises a voltage evaluating unit that evaluates a status of charging the capacitor based on a voltage level or voltage change of the capacitor voltage, and
   on a basis of an evaluation result made by the voltage evaluating unit based on the voltage level or the voltage change of the capacitor voltage, the frequency control unit changes the frequency from the variable frequency to the steady frequency.

5. The DC pulse power supply device according to claim 1, further comprises a regeneration unit that regenerates to the DC power supply a component of the reactor voltage in the DC reactor that exceeds a set voltage, wherein
   the regeneration unit comprises the capacitor connected in parallel to the DC reactor, the capacitor using the reactor voltage in the DC reactor as regeneration input voltage.

6. A frequency control method for a DC pulse power supply device that comprises:
   a DC power supply;
   a pulsing unit that is connected to the DC power supply to generate a pulse output by a step-up chopper circuit comprising a series circuit composed of a DC reactor and a switching element;
   a pulsing unit that is connected to the DC power supply to generate a pulse output by a step-up chopper circuit comprising a series circuit composed of a DC reactor and a switching element;
   a voltage clamping unit that comprises a capacitor connected in parallel to the DC reactor of the pulsing unit, and uses a capacitor voltage in the capacitor to clamp a voltage across the DC reactor to a clamp voltage; and
   a control circuit unit that controls a switching operation of the switching element of the pulsing unit, wherein
   the control circuit unit performs,
   in a pulse mode control for controlling a pulsing operation in a pulse mode for generating a pulse output,
   frequency control is performed with a variable frequency for making a frequency of the pulsing operation variable by gradually increasing or gradually decreasing a time width in each cycle of multiple cycles in an initial stage of the pulsing operation,
   the pulsing operation with the variable frequency is for fixing a time width in an ON period during which the switching element is closed to pass a current through the DC reactor, while gradually decreasing a time width in an OFF period during which the switching element is open to perform clamping on the DC reactor based on a capacitor voltage, so as to reset magnetic saturation of the DC reactor.

7. The frequency control method for the DC pulse power supply device according to claim 6, wherein the control circuit unit changes the stage from the initial stage to a steady stage when the capacitor voltage in the capacitor is charged to a level of a specified voltage.

8. The frequency control method for the DC pulse power supply device according to claim 7, wherein the control circuit unit changes the stage from the initial stage to the steady stage when a voltage change of the capacitor voltage in the capacitor stays within a predetermined fluctuation range.

9. The frequency control method for the DC pulse power supply device according to claim 8, wherein the specified voltage is a reset voltage for resetting the magnetic saturation of the DC reactor.

* * * * *